United States Patent
Long et al.

(10) Patent No.: US 12,211,859 B2
(45) Date of Patent: Jan. 28, 2025

(54) LIGHT-EMITTING SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chunping Long, Beijing (CN); Qi Qi, Beijing (CN); Wanzhi Chen, Beijing (CN); Xinxin Zhao, Beijing (CN)

(73) Assignees: BEIJING BOE TECHNOLOGY DEVELOPMENT CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 388 days.

(21) Appl. No.: 17/641,557

(22) PCT Filed: Mar. 19, 2021

(86) PCT No.: PCT/CN2021/081848
§ 371 (c)(1),
(2) Date: Mar. 9, 2022

(87) PCT Pub. No.: WO2022/193301
PCT Pub. Date: Sep. 22, 2022

(65) Prior Publication Data
US 2023/0352492 A1 Nov. 2, 2023

(51) Int. Cl.
*H01L 27/12* (2006.01)
*H01L 25/16* (2023.01)
(Continued)

(52) U.S. Cl.
CPC ........ *H01L 27/1248* (2013.01); *H01L 25/167* (2013.01); *H01L 33/62* (2013.01); *H01L 33/30* (2013.01)

(58) Field of Classification Search
None
See application file for complete search history.

(56) References Cited

U.S. PATENT DOCUMENTS

| 2018/0088425 A1 | 3/2018 | Kimura |
| 2020/0152845 A1 | 5/2020 | Lee et al. |

(Continued)

FOREIGN PATENT DOCUMENTS

| CN | 110265458 A | 9/2019 |
| CN | 110416244 A | 11/2019 |

(Continued)

OTHER PUBLICATIONS

Machine-generated English translation of CN 111900184 (Year: 2020).*

*Primary Examiner* — Bo B Jang
(74) *Attorney, Agent, or Firm* — Dilworth & Barrese, LLP.; Michael J. Musella, Esq.

(57) ABSTRACT

A light-emitting substrate and a display device. The light-emitting substrate includes a base substrate, an electrode layer and a definition pattern layer; the electrode layer is at a side of the base substrate, and the definition pattern layer is at a side of the electrode layer away from the base substrate; the electrode layer includes a first electrode, and the definition pattern layer covers at least a part of the first electrode; the definition pattern layer includes a plurality of first openings, the plurality of first openings expose a same first electrode. Therefore, the light-emitting substrate can ensure the bonding success rate of the light-emitting substrate, and thus can further improve the product yield of the light-emitting substrate.

19 Claims, 12 Drawing Sheets

(51) Int. Cl.
    *H01L 33/30*     (2010.01)
    *H01L 33/62*     (2010.01)

(56)            References Cited

U.S. PATENT DOCUMENTS

2020/0212117 A1 *   7/2020   Jeon .................... H01L 27/1218
2021/0091057 A1     3/2021   Liang et al.

FOREIGN PATENT DOCUMENTS

| CN | 110544704 A | 12/2019 |
| CN | 110571234 A | 12/2019 |
| CN | 111724744 A | 9/2020 |
| CN | 111816119 A | 10/2020 |
| CN | 111900184 A | 11/2020 |
| CN | 111969025 A | 11/2020 |
| CN | 112133253 A | 12/2020 |
| CN | 112151576 A | 12/2020 |

\* cited by examiner

LIGHT-EMITTING SUBSTRATE AND DISPLAY DEVICE

TECHNICAL FIELD

At least one embodiment of the present disclosure relates to a light-emitting substrate and a display device.

BACKGROUND

With the continuous development of display technology, organic light-emitting diode (OLED) display technology has been increasingly used in various electronic devices because of having advantages of self-illumination, wide viewing angle, high contrast, low power consumption and high reaction speed.

On the other hand, with the continuous development of the OLED display technology, people have higher requirements for power consumption, color shift, brightness, stability and other performance of OLED display products.

SUMMARY

At least one embodiment of the present disclosure provides a light-emitting substrate and a display device. In the manufacturing process of the light-emitting substrate, in a case that an anode or a cathode of a light-emitting diode is bound with a first electrode, a plurality of first openings can be used to bond the anode or the cathode of the light-emitting diode; at this time, even if one of the plurality of first openings fails to bond, the other openings of the plurality of first openings can still be used to bond the anode or the cathode of the light-emitting diode, so as to ensure the bonding success rate of the light-emitting substrate, and then improve the product yield of the light-emitting substrate. On the other hand, since the plurality of first openings correspond to a plurality of bonding positions (pads), the contact resistance and current loss can be reduced, so as to ensure the stability and accuracy of the light-emitting current of the light-emitting diode, and then improve the display quality of the light-emitting substrate.

At least one embodiment of the present disclosure provides a light-emitting substrate, and the light-emitting substrate includes: a base substrate; an electrode layer, at a side of the base substrate; and a definition pattern layer, at a side of the electrode layer away from the base substrate, in which the electrode layer includes a first electrode, the definition pattern layer at least covers a part of the first electrode, and the definition pattern layer includes a plurality of first openings, and the plurality of first openings expose a same first electrode.

For example, in the light-emitting substrate provided by at least one embodiment of the present disclosure, the electrode layer further includes a second electrode, the first electrode and the second electrode are insulated from each other and are spaced apart from each other, the definition pattern layer covers a part of the second electrode, and the definition pattern layer further includes at least one second opening, and the at least one second opening exposes a same second electrode.

For example, in the light-emitting substrate provided by at least one embodiment of the present disclosure, orthographic projections of the first openings on the base substrate are within an orthographic projection of the same first electrode on the base substrate, and an orthographic projection of the at least one second opening on the base substrate is within an orthographic projection of the same second electrode on the base substrate.

For example, in the light-emitting substrate provided by at least one embodiment of the present disclosure, the at least one second opening comprises a plurality of the second openings.

For example, in the light-emitting substrate provided by at least one embodiment of the present disclosure, a size of the first electrode in a first direction is larger than a size of the first electrode in a second direction, the second direction is perpendicular to the first direction, and the plurality of first openings are arranged along the first direction.

For example, in the light-emitting substrate provided by at least one embodiment of the present disclosure, a material of the definition pattern layer comprises an insulation material.

For example, the light-emitting substrate provided by at least one embodiment of the present disclosure, further includes: a light-emitting diode, at a side of the definition pattern layer away from the base substrate, in which the light-emitting diode comprises a third electrode and a fourth electrode, the third electrode includes a plurality of third sub-electrodes, the plurality of third sub-electrodes are connected to the first electrode through the plurality of first openings, and the fourth electrode is connected to the second electrode.

For example, in the light-emitting substrate provided by at least one embodiment of the present disclosure, the fourth electrode of the light-emitting diode comprises a plurality of fourth sub-electrodes.

For example, in the light-emitting substrate provided by at least one embodiment of the present disclosure, the light-emitting diode further includes: a first semiconductor layer, including a first region and a second region, wherein the fourth electrode is in the second region; a light-emitting layer, in the first region; and a second semiconductor layer, at a side of the light-emitting layer away from the first semiconductor layer, in which the third electrode is at a side of the second semiconductor layer away from the light-emitting layer.

For example, the light-emitting substrate provided by at least one embodiment of the present disclosure, further includes: a driver circuit layer, between the base substrate and the electrode flat layer, in which the driver circuit layer includes a plurality of driver circuits, the electrode layer includes a plurality of the first electrodes, and the plurality of driver circuits are electrically connected to the plurality of first electrodes.

For example, in the light-emitting substrate provided by at least one embodiment of the present disclosure, the driver circuit includes a driver transistor, a data writing transistor, a first light emission control transistor, a second light emission control transistor, an electrode reset transistor, a reset transistor and a compensation transistor, a material of active layers of the driver transistor, the data writing transistor, the first light emission control transistor, the second light emission control transistor and the electrode reset transistor is low-temperature polycrystalline silicon, and a material of active layers of the reset transistor and the compensation transistor is an oxide semiconductor.

For example, in the light-emitting substrate provided by at least one embodiment of the present disclosure, a width-length ratio of a channel of the driver transistor is greater than twice a width-length ratio of a channel of the data writing transistor.

For example, in the light-emitting substrate provided by at least one embodiment of the present disclosure, the reset transistor and the compensation transistor adopt a double-gate structure.

For example, in the light-emitting substrate provided by at least one embodiment of the present disclosure, the driver circuit further comprises a data line and a power line, and a width of the power line is greater than five times a width of the data line.

For example, in the light-emitting substrate provided by at least one embodiment of the present disclosure, the driver circuit further includes a power line, and an orthographic projection of the power line on the base substrate at least partially overlaps with an orthographic projection of the driver transistor on the base substrate.

For example, in the light-emitting substrate provided by at least one embodiment of the present disclosure, the orthographic projection of the power line on the base substrate at least partially overlaps with an orthographic projection of the electrode reset transistor on the base substrate.

For example, in the light-emitting substrate provided by at least one embodiment of the present disclosure, an orthographic projection of the power line on the base substrate at least partially overlaps with an orthographic projection of the compensation transistor and an orthographic projection of the reset transistor on the base substrate.

At least one embodiment of the present disclosure further provides a display device, and the display device includes any one of the light-emitting substrates mentioned above.

BRIEF DESCRIPTION OF THE DRAWINGS

In order to clearly illustrate the technical solution of the embodiments of the present disclosure, the drawings of the embodiments will be briefly described in the following, it is obvious that the described drawings are only related to some embodiments of the present disclosure and thus are not limitative of the present disclosure.

DETAILED DESCRIPTION

Figure 1:
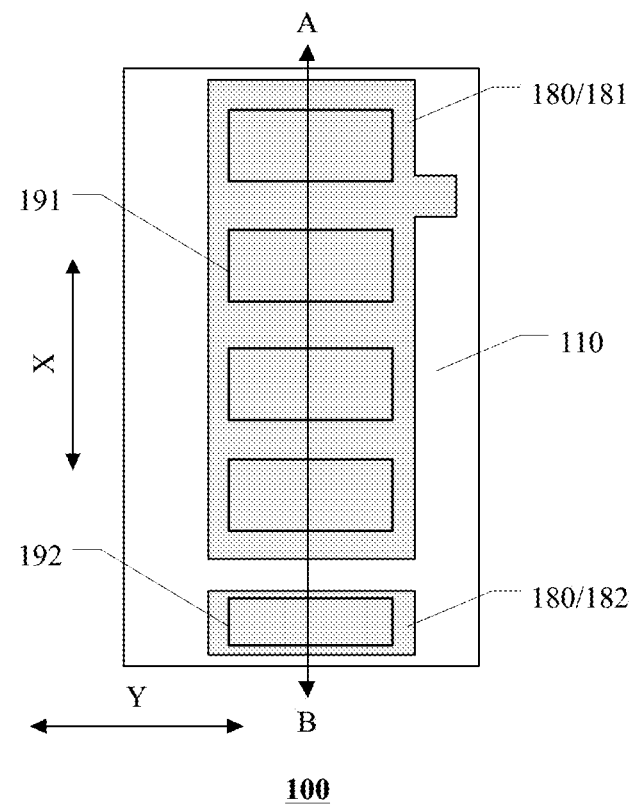
FIG. 1 is a schematic planar view of a light-emitting substrate provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

At least one embodiment of the present disclosure provides a light-emitting substrate and a display device. The light-emitting substrate comprises a base substrate, an electrode layer, and a definition pattern layer; the electrode layer is at a side of the base substrate; the definition pattern layer is at a side of the electrode layer away from the base substrate; the electrode layer comprises a first electrode, the definition pattern layer at least covers a part of the first electrode, and the definition pattern layer comprises a plurality of first openings, and the plurality of first openings expose a same one first electrode. Therefore, in a case that an anode or a cathode of a light-emitting diode is bound to the first electrode, the first openings can be used to be bonded with the anode or the cathode of the light-emitting diode; in this case, even if one of the first openings fails to be bonded with the anode or the cathode of the light-emitting diode, the other openings of the first openings can still be used to be bonded with the anode or the cathode of the light-emitting diode, so that the bonding success rate of the light-emitting substrate can be guaranteed, and thus the product yield of the light-emitting substrate can be further improved. On the other hand, because the plurality of first openings correspond to a plurality of bonding positions (pads), the contact resistance and current loss can be reduced, and thereby the stability and accuracy of the light-emitting current of the light-emitting diode can be ensured, and further the display quality of the light-emitting substrate can be improved.

In the following, the light-emitting substrate and the display device provided by the embodiments of the present disclosure are described in detail with reference to the drawings.

Figure 2A:
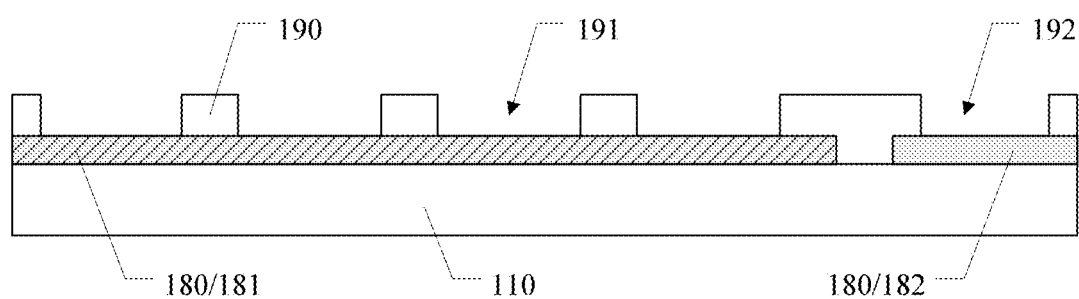
FIG. 2A is a schematic cross-sectional view of a light-emitting substrate taken along the line AB in FIG. 1 provided by an embodiment of the present disclosure.
Figure 2B:
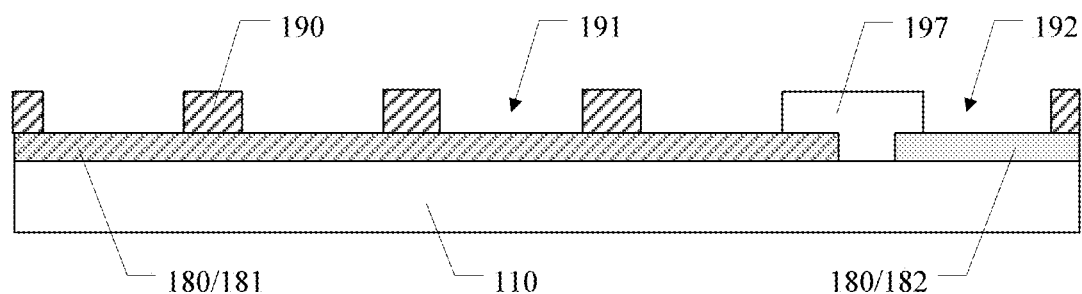
FIG. 2B is a schematic cross-sectional view of another light-emitting substrate provided by an embodiment of the present disclosure taken along the line AB in FIG. 1.

At least one embodiment of the present disclosure provides a light-emitting substrate. FIG. 1 is a schematic planar view of a light-emitting substrate provided by an embodiment of the present disclosure; FIG. 2A is a schematic cross-sectional view of a light-emitting substrate taken along the line AB in FIG. 1 provided by an embodiment of the present disclosure; FIG. 2B is a schematic cross-sectional view of another light-emitting substrate provided by an embodiment of the present disclosure taken along the line AB in FIG. 1.

As illustrated in FIG. 1 and FIG. 2A, the light-emitting substrate 100 includes a base substrate 110, an electrode flat layer 170, an electrode layer 180 and a definition pattern layer 190; the electrode flat layer 170 is located on the base substrate 110, the electrode layer 180 is located on a side of the electrode flat layer 190 away from the base substrate 110, and the definition pattern layer 190 is located on a side of the electrode layer 180 away from the electrode flat layer 170.

For example, the electrode layer 180 may be a stack of titanium/aluminum/titanium, and a thickness of the electrode layer 180 may range from 800 nm to 1500 nm, such as 1000 nm to 1200 nm; the electrode flat layer 170 may be made of polyimide (PI), and a thickness of the electrode flat layer 170 may range from 10 microns to 15 microns. Of course, the embodiments of the present disclosure include but are not limited to these cases, and the materials and thicknesses of the definition pattern layer, the electrode layer and the electrode flat layer may be determined according to actual requirements.

As illustrated in FIG. 1 and FIG. 2A, the electrode layer 180 includes a first electrode 181, and the definition pattern layer 190 covers at least a part of the first electrode 181. The definition pattern layer 190 includes a plurality of first openings 191, the plurality of first openings 191 expose the same first electrode 181. That is, orthographic projections of the first openings 191 on the base substrate 110 fall within an orthographic projection of the same first electrode 181 on the base substrate 110.

In the light-emitting substrate provided by at least an embodiment of the present disclosure, in the case that an anode or a cathode of a light-emitting diode is bound to the first electrode, the first openings can be used to be bonded with the anode or the cathode of the light-emitting diode; in this case, even if one of the first openings fails to be bonded with the anode or the cathode of the light-emitting diode, the other openings of the first openings can still be used to be bonded with the anode or the cathode of the light-emitting diode, so that the bonding success rate of the light-emitting substrate can be guaranteed, and thus the product yield of the light-emitting substrate can be further improved. On the other hand, because the plurality of first openings correspond to a plurality of bonding positions (pads), the contact resistance and current loss can be reduced, and thereby the stability and accuracy of the light-emitting current of the light-emitting diode can be ensured, and further the display quality of the light-emitting substrate can be improved. On the other hand, because the light-emitting diode (LED) itself has a high luminous efficiency and a long service life, the light-emitting substrate also has a high luminous efficiency and a long service life. It should be noted that, a conductive connection part that electrically connects the first electrode or the second electrode and the anode or the cathode of the light-emitting diode is regarded as a pad.

In some examples, a material of the definition pattern layer 190 includes an insulation material; the material of the definition pattern layer 190 may be polyimide, and a thickness of the definition pattern layer 190 may range from 8 microns to 12 microns. Of course, the embodiments of the present disclosure include but are not limited to this case. The definition pattern layer may be made of a conductive material.

For example, as illustrated in FIG. 2B, the definition pattern layer 190 and the electrode layer 180 may be formed by patterning a same conductive layer, and in this case, the conductive layer can have a recessed portion 191, that is, the first opening 191 mentioned above. Of course, the embodiments of the present disclosure include but are not limited to this case. The definition pattern layer and the electrode layer may be formed by sequentially forming two conductive layers, and the materials of the two conductive layers may be the same or different.

For example, as illustrated in FIG. 2B, in a case that both the definition pattern layer 190 and the electrode layer 180 are made of a conductive material, an insulation part 197 may be provided between the first electrode 181 and the second electrode 182.

In some examples, as illustrated in FIG. 1 and FIG. 2A, a shape of an orthographic projection of the first opening 191 on the base substrate 110 may be rectangular. Of course, the embodiments of the present disclosure include but are not limited to this case, and the orthographic projection of the first opening 191 on the base substrate 110 may be in other shapes.

In some examples, a size (depth) of the first opening 191 in a direction perpendicular to the base substrate 110 may be the same or different, and the shapes and the sizes of the orthographic projections of the plurality of first openings 191 on the base substrate 110 may be the same or different.

In some examples, as illustrated in FIG. 1 and FIG. 2A, the electrode layer 180 further includes a second electrode 182, the first electrode 181 and the second electrode 182 are insulated from each other and are spaced apart from each other, the definition pattern layer 190 covers a part of the second electrode 182, and the definition pattern layer 190 further includes at least one second opening 192, the at least one second opening 192 exposes the same one second electrode 182. That is, an orthographic projection of the at least one second opening 192 on the base substrate 110 falls within an orthographic projection of the second electrode 182 on the base substrate 110. Therefore, the second opening 192 can also be used as the anode or the cathode of the light-emitting diode.

For example, as illustrated in FIG. 1 and FIG. 2A, the first electrode 181 and the second electrode 182 are arranged in a same layer, and the first electrode 181 and the second electrode 182 may be formed by a same one patterning process. It should be noted that, the above mentioned patterning process may include processes of photoresist coating, exposure, development, etching and other processes.

In some examples, as illustrated in FIG. 1 and FIG. 2A, a size of the first electrode 181 in a first direction X is larger than a size of the first electrode 181 in a second direction, and the second direction is perpendicular to the first direction, and the plurality of first openings 191 are arranged along the first direction X, therefore enabling the first openings 191 to have a large width, thereby facilitating the bonding with the first openings 191. Of course, the embodiments of the present disclosure include but are not limited to this case, and the plurality of first openings 191 may be arranged along the second direction or arranged in an array.

For example, the first direction X may be an extension direction of the data lines of the light-emitting substrate. Of course, the embodiments of the present disclosure include but are not limited to this case.

In some examples, as illustrated in FIG. 1 and FIG. 2A, the first electrode 181 and the second electrode 182 are arranged along the first direction, and the plurality of first openings 191 and the at least one second opening 192 are arranged along the first direction X. Of course, the embodiments of the present disclosure include but are not limited to this case.

In some examples, transparent substrates such as glass substrates, quartz substrates, plastic substrates may be used as the base substrate 110, or flexible substrates made of, for example, polyimide may also be used as the base substrate 110. The embodiments of the present disclosure are not limited to these cases herein.

Figure 3:
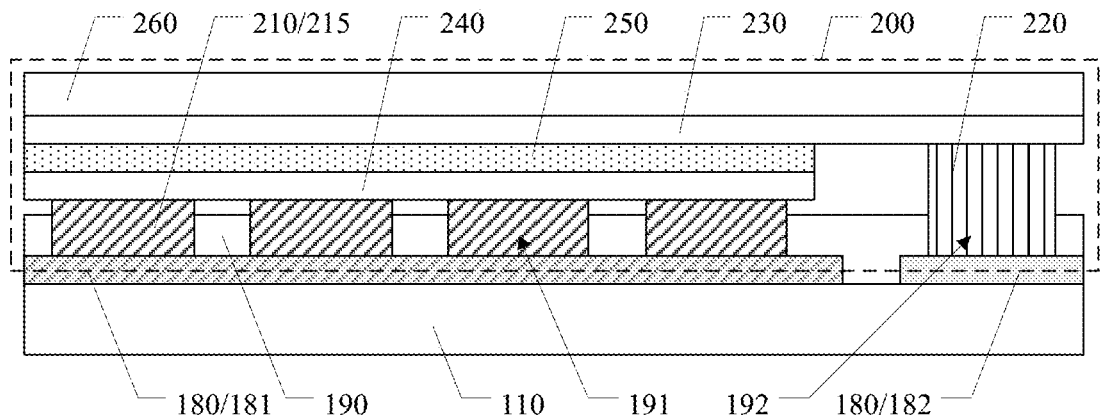
FIG. 3 is a schematic cross-sectional view of further another light-emitting substrate provided by an embodiment of the present disclosure.

FIG. 3 is a schematic cross-sectional view of another light-emitting substrate provided by an embodiment of the present disclosure. As illustrated in FIG. 3, the light-emitting substrate 100 further includes a light-emitting diode 200; the light-emitting diode 200 is located at a side of the definition pattern layer 190 away from the base substrate 110; the light-emitting diode 200 includes a third electrode 210 and a fourth electrode 220, the third electrode 210 includes a plurality of third sub-electrodes 215, the plurality of third sub-electrodes 215 are connected to the first electrode 181 through the plurality of first openings 191, and the fourth electrode 220 is connected to the second electrode 182. Therefore, the light-emitting substrate can apply a driving voltage to the light-emitting substrate through the first electrode and the second electrode, thereby driving the light-emitting diode to emit light.

Figure 4:
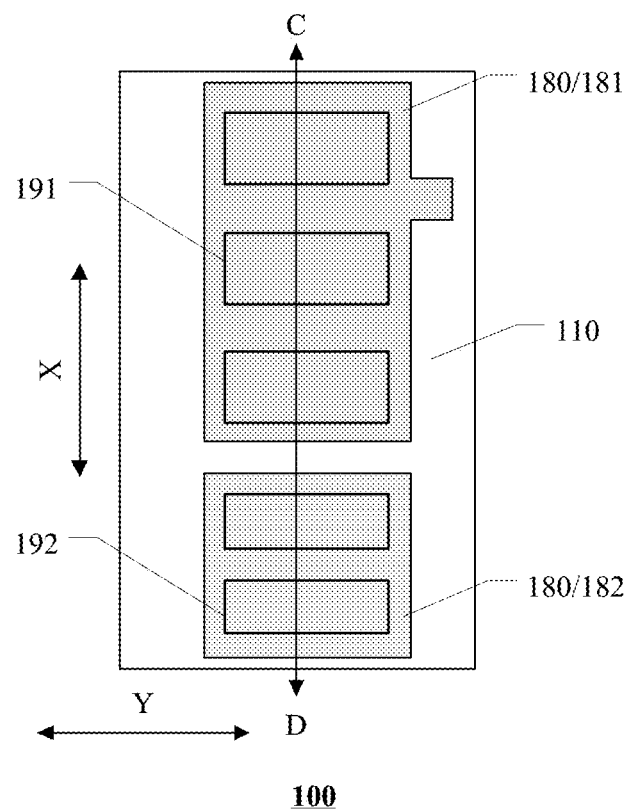
FIG. 4 is a schematic planar view of yet another light-emitting substrate provided by an embodiment of the present disclosure.
Figure 5:
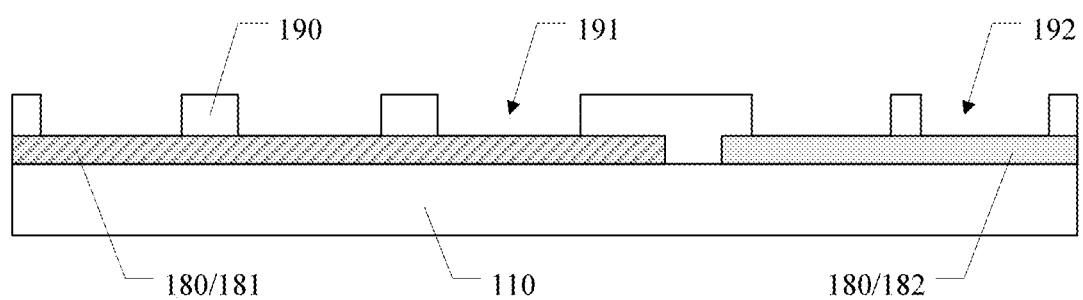
FIG. 5 is a schematic cross-sectional view of the light-emitting substrate taken along the line CD in FIG. 4 provided by an embodiment of the present disclosure.

FIG. 4 is a schematic planar view of yet another light-emitting substrate provided by an embodiment of the present disclosure; FIG. 5 is a schematic cross-sectional view of the light-emitting substrate taken along the line CD in FIG. 4 provided by an embodiment of the present disclosure.

As illustrated in FIG. 4 and FIG. 5, the at least one second opening 192 includes a plurality of second openings 192; that is, the definition pattern layer 190 further includes a plurality of second openings 192, and the plurality of second openings 192 expose the same second electrode 182. In a case that the anode or the cathode of the light-emitting diode is bound to the second electrode, the second openings can be used to be bonded with the anode or the cathode of the light-emitting diode; in this case, even if one of the second openings fails to be bonded with the anode or the cathode of the light-emitting diode, the other openings of the second openings can still be used to be bonded with the anode or the cathode of the light-emitting diode, so that the bonding success rate of the light-emitting substrate can be guaranteed, and thus the product yield of the light-emitting substrate can be further improved. On the other hand, because the plurality of second openings correspond to a plurality of bonding positions (pads), the contact resistance and current loss can be reduced, and thereby the stability and accuracy of the light-emitting current of the light-emitting diode can be ensured, and further the display quality of the light-emitting substrate can be improved.

In some examples, as illustrated in FIG. 4 and FIG. 5, the first opening 191 can be used to be bonded with the anode of the light-emitting diode, and the second opening 192 can be used to be bonded with the cathode of the light-emitting diode. Of course, embodiments of the present disclosure include, but are not limited to this case, the first opening can be used to be bonded with the cathode of the light-emitting diode, and the second opening can be used to be bonded with the anode of the light-emitting diode.

Figure 6:
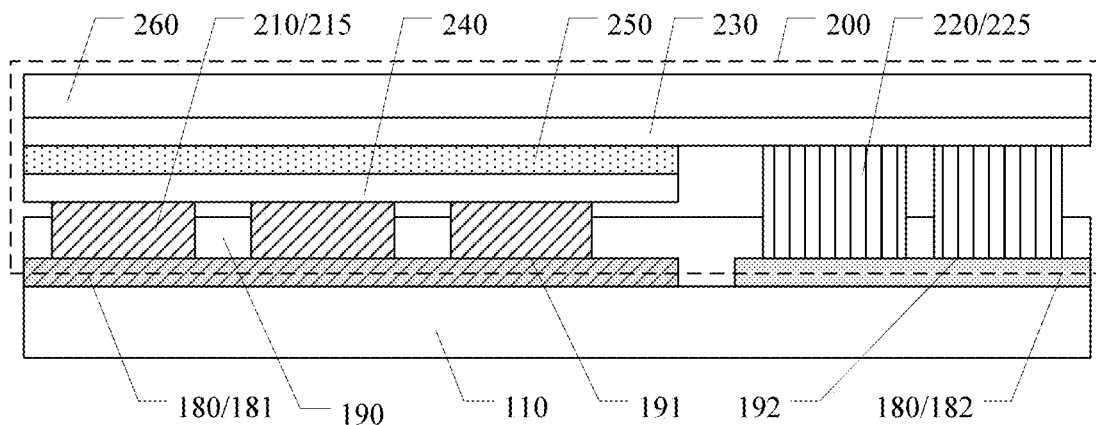
FIG. 6 is a schematic cross-sectional view of yet another light-emitting substrate provided by an embodiment of the present disclosure.

FIG. 6 is a schematic cross-sectional view of another light-emitting substrate provided by an embodiment of the present disclosure. As illustrated in FIG. 6, the light-emitting substrate 100 further includes a light-emitting diode 200; the light-emitting diode 200 is located at the side of the definition pattern layer 190 away from the base substrate 110; the light-emitting diode 200 includes a third electrode 210 and a fourth electrode 220, the third electrode 210 includes a plurality of third sub-electrodes 215, the plurality of third sub-electrodes 215 are connected to the first electrode 181 through the plurality of first openings 191. The fourth electrode 220 includes a plurality of fourth sub-electrodes 225, and the plurality of fourth sub-electrodes 225 are connected to the second electrode 182 through the plurality of second openings 192. Therefore, the light-emitting substrate can apply driving voltage to the light-emitting substrate through the first electrode and the second electrode, thereby driving the light-emitting diode to emit light.

Figure 7:
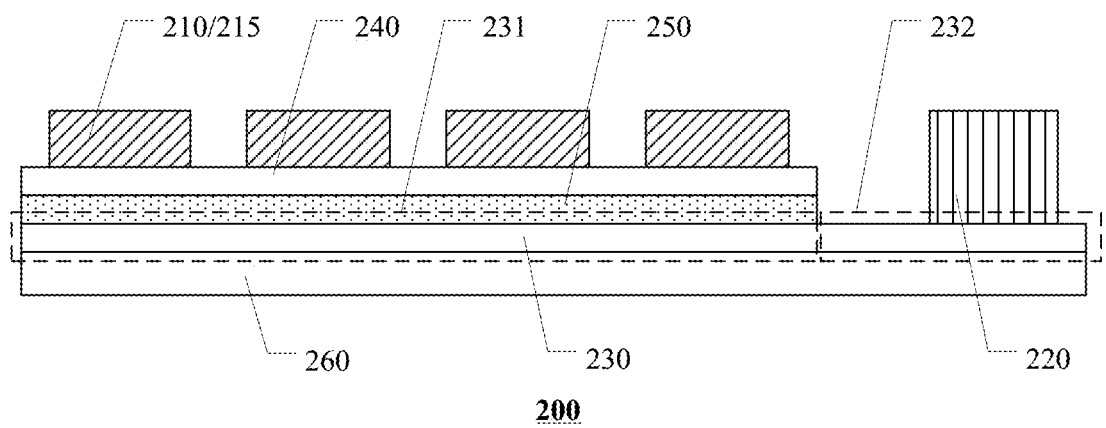
FIG. 7 is a schematic diagram of a light-emitting diode provided by an embodiment of the present disclosure.

FIG. 7 is a schematic diagram of a light-emitting diode provided by an embodiment of the present disclosure. As illustrated in FIG. 7, the light-emitting diode 200 further includes a first semiconductor layer 230, a second semiconductor layer 240 and a light-emitting layer 250; the first semiconductor layer 230 includes a first region 231 and a second region 232, and the fourth electrode 220 is located in the second region 232; the light-emitting layer 250 is located in the first region 231; the second semiconductor layer 240 is located on a side of the light-emitting layer 250 away from the first semiconductor layer 230, and the third electrode 210 is located on a side of the second semiconductor layer 240 away from the light-emitting layer 250.

In some examples, both a material of the third electrode 210 and a material of the fourth electrode 220 may be at least one selected from a group consisting of chromium (Cr), titanium (Ti), aluminum (Al), gold (Au), nickel (Ni) and indium tin oxide (ITO), or may be an alloy made of at least two selected from a group consisting of chromium (Cr), titanium (Ti), aluminum (Al), gold (Nu), nickel (Ni) and indium tin oxide (ITO). Both a thickness of the third electrode 210 and a thickness the fourth electrode 220 may range from 1 nm to 100 nm. Of course, the embodiments of the present disclosure include but are not limited to this case, and the materials and thicknesses of the third electrode and the fourth electrode may be determined according to actual requirements.

In some examples, the light-emitting diode 200 may adopt semiconductor light-emitting diodes including semiconductors in groups III-V of the periodic table of chemical element. For example, the first semiconductor layer 230 may be an N-type semiconductor layer, for example, is made of a semiconductor material represented by a structural formula $In_xAl_yGa_{1-x-y}N$ ($0 \leq x \leq 1$, $0 \leq y \leq 1$, $0 \leq x+y \leq 1$).

For example, a material of the first semiconductor layer 230 may be one or more selected from a group consisting of aluminum indium gallium nitride, gallium nitride (GaN), aluminum gallium nitride (AlGaN), indium gallium nitride (InGaN), aluminum nitride (AlN) and indium nitride (InN); a thickness of the first semiconductor layer 230 may range from 500 nm to 5000 nm.

For example, the light-emitting layer 250 may have a single quantum well structure or a multi-quantum well structure; a material of the light-emitting layer 250 may be aluminum gallium nitride, indium aluminum gallium nitride (AlInGaN), etc.; and a thickness of the light-emitting layer 250 may range from 10 nm to 200 nm.

In some examples, the second semiconductor layer 240 may be a P-type semiconductor layer, such as a semiconductor material represented by a structural formula $In_xAl_yGa_{1-x-y}N$ ($0 \le x \le 1$, $0 \le y \le 1$, $0 \le x+y \le 1$).

For example, a material of the second semiconductor layer 240 may be one or more selected from a group consisting of aluminum indium gallium nitride, gallium nitride, aluminum gallium nitride, indium gallium nitride, aluminum nitride and indium nitride; and a thickness of the second semiconductor layer 240 may range from 50 nm to 500 nm.

For example, the light-emitting diode 200 further includes a substrate 260 located on a side of the first semiconductor layer 230 away from the light-emitting layer 250.

It should be noted that, in a manufacturing process of the light-emitting substrate provided by the embodiment of the present disclosure, methods of mass transfer, laser transfer, self-calibration transfer, or stamp transfer to transfer the light-emitting diode onto the light-emitting substrate may be adopted. Of course, the embodiments of the present disclosure include but are not limited to these cases, and in the manufacturing process of the light-emitting substrate provided by the embodiments of the present disclosure, the light-emitting diode may be transferred onto the light-emitting substrate in other suitable ways.

Figure 8:
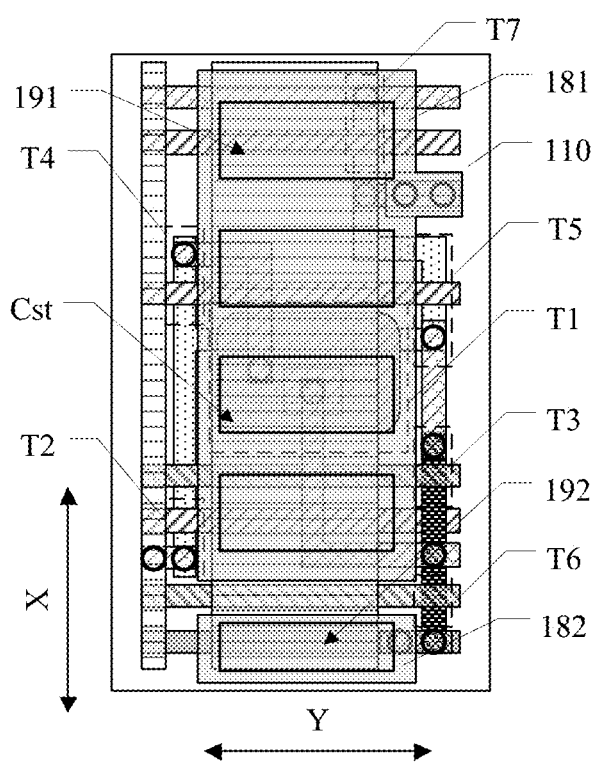
FIG. 8 is a schematic planar view of further another light-emitting substrate provided by an embodiment of the present disclosure.
Figure 9:
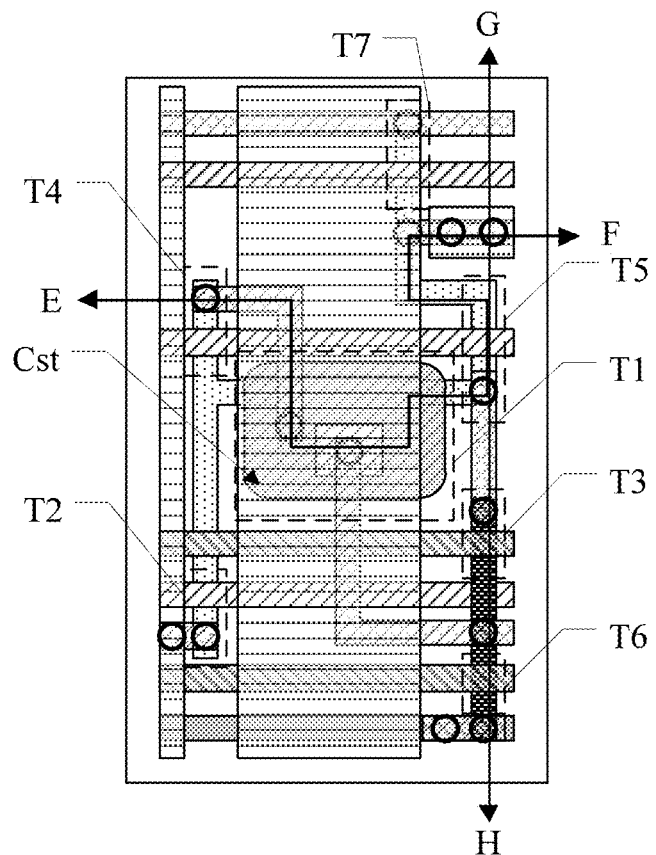
FIG. 9 is a schematic planar view of further another light-emitting substrate provided by an embodiment of the present disclosure.
Figure 10A:
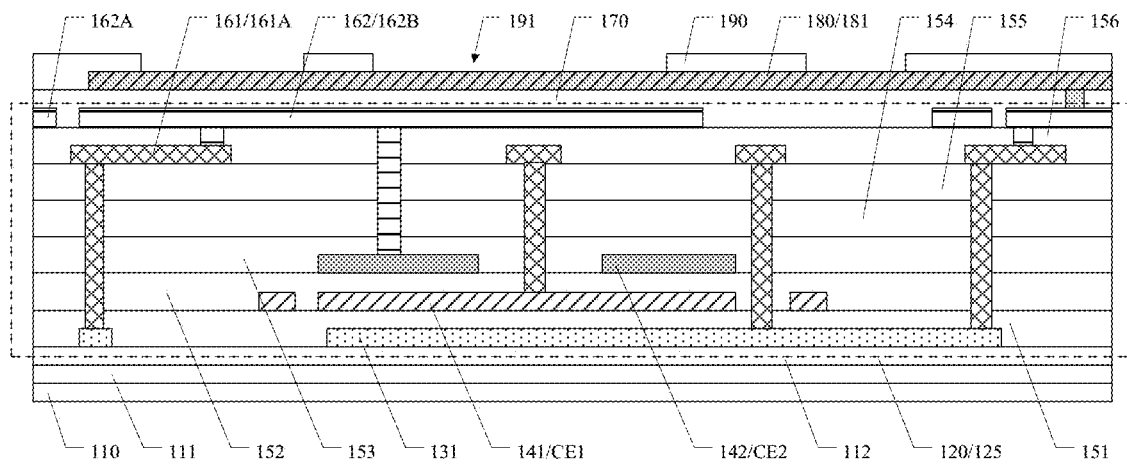
FIG. 10A is a schematic cross-sectional view of further another light-emitting substrate provided by an embodiment of the present disclosure taken along the line EF in FIG. 9.
Figure 10B:
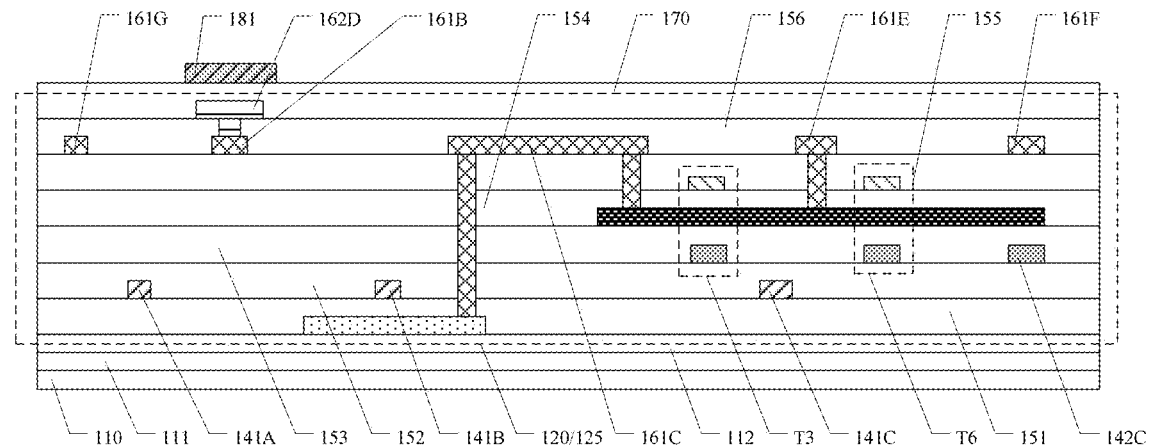
FIG. 10B is a schematic cross-sectional view of further another light-emitting substrate taken along the line GH in FIG. 9 provided by an embodiment of the present disclosure.
Figure 11:
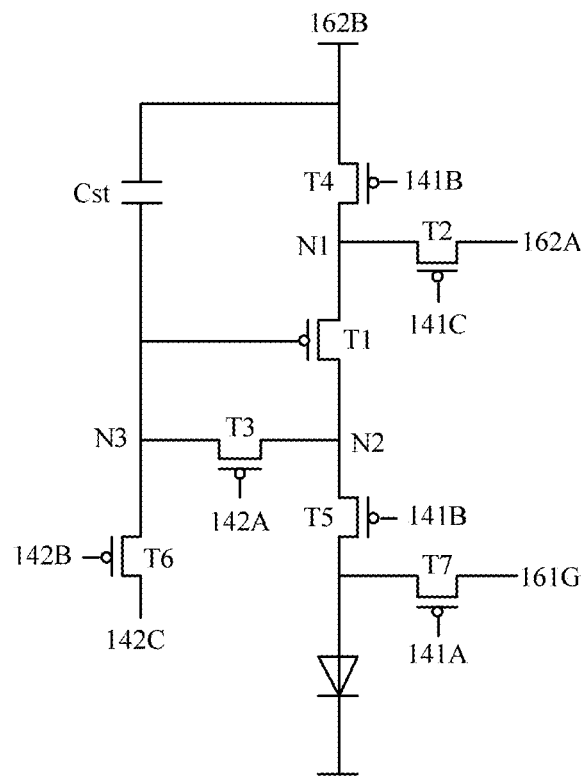
FIG. 11 is an equivalent schematic diagram of a driver circuit of another light-emitting substrate provided by an embodiment of the present disclosure.

FIG. 8 is a schematic planar view of further another light-emitting substrate provided by an embodiment of the disclosure; FIG. 9 is a schematic planar view of further another light-emitting substrate provided by an embodiment of the present disclosure; FIG. 10A is a schematic cross-sectional view of further another light-emitting substrate provided by an embodiment of the present disclosure taken along the line EF in FIG. 9; FIG. 10B is a schematic cross-sectional view of further another light-emitting substrate taken along the line GH in FIG. 9 provided by an embodiment of the present disclosure; FIG. 11 is an equivalent schematic diagram of a driver circuit of another light-emitting substrate provided by an embodiment of the present disclosure. It should be noted that, in order to better show the line EF, the light-emitting substrate illustrated in FIG. 9 does not show the electrode layer.

As illustrated in FIG. 8, FIG. 9, FIG. 10A and FIG. 10B, the light-emitting substrate 100 includes a base substrate 110, an electrode flat layer 170, an electrode layer 180 and a definition pattern layer 190; the electrode flat layer 170 is located on the base substrate 110, the electrode layer 180 is located on a side of the electrode flat layer 190 away from the base substrate 110, and the definition pattern layer 190 is located on a side of the electrode layer 180 away from the electrode flat layer 170. The electrode layer 180 includes a first electrode 181. The definition pattern layer 190 covers at least a part of the first electrode 181. The definition pattern layer 190 includes a plurality of first openings 191, the plurality of first openings 191 expose the same one first electrode 181. That is, orthographic projections of the first openings 191 on the base substrate 110 fall within an orthographic projection of the same one first electrode 181 on the base substrate 110. Therefore, in the case that an anode or a cathode of a light-emitting diode is bound to the first electrode, the first openings can be used to be bonded with the anode or the cathode of the light-emitting diode; in this case, even if one of the first openings fails to be bonded with the anode or the cathode of the light-emitting diode, the other openings of the first openings can still be used to be bonded with the anode or the cathode of the light-emitting diode, so that the bonding success rate of the light-emitting substrate can be guaranteed, and thus the product yield of the light-emitting substrate can be further improved. On the other hand, because the plurality of first openings correspond to a plurality of bonding positions (pads), the contact resistance and current loss can be reduced, and thereby the stability and accuracy of the light-emitting current of the light-emitting diode can be ensured, and further the display quality of the light-emitting substrate can be improved. On the other hand, because a plurality of first openings correspond to a plurality of bonding positions (pads), the contact resistance and the current loss can be reduced, so that the stability and accuracy of the light-emitting current of the light-emitting diode can be ensured, and further the display quality of the light-emitting substrate can be improved. In addition, because the light-emitting diode (LED) itself has a high luminous efficiency and a long service life, the light-emitting substrate also has a high luminous efficiency and a long service life.

As illustrated in FIG. 8, FIG. 9, FIG. 10A and FIG. 10B, the light-emitting substrate 100 further includes a driver circuit layer 120 located between the base substrate 110 and the electrode flat layer 170; the driver circuit layer 120 includes a plurality of driver circuits 125; the electrode layer 180 includes a plurality of first electrodes 181; the plurality of driver circuits 125 may be electrically connected to the plurality of first electrodes 181, that is, one of the first electrodes 181 corresponds to one of the driver circuits 125; the driver circuit 120 is electrically connected to the corresponding first electrode 181, thereby providing a driving signal for the corresponding first electrode 181.

In some examples, as illustrated in FIG. 8, FIG. 9, FIG. 10A and FIG. 10B, the light-emitting substrate 100 further includes a barrier layer 111 and a buffer layer 112 which are configured to modify defects on the base substrate or provide a better substrate for the subsequently formed semiconductor layer.

In some examples, the barrier layer 111 and the buffer layer 112 may adopt a single-layer structure or a multi-layer structure. For example, the barrier layer 111 may be a stack of silicon oxide/single crystal silicon/silicon oxide, and the buffer layer 112 may be a stack of silicon nitride and silicon oxide. A thickness of the barrier layer 111 may range from 10 microns to 30 microns; a thickness of the buffer layer 112 may range from 2 microns to 5 microns. Of course, the embodiments of the present disclosure include but are not limited to this case, the materials and thicknesses of the barrier layer and the buffer layer may be determined according to actual requirements.

In some examples, as illustrated in FIG. 9 and FIG. 11, the driver circuit 125 includes a driver transistor T1, a data writing transistor T2, a first light emission control transistor T4, a second light emission control transistor T5, an electrode reset transistor T7, a reset transistor T6 and a compensation transistor T3. Therefore, the driver circuit may adopt a 7T1C structure, and in this case, the driver circuit 125 may further include a storage capacitor Cst. Of course, the embodiments of the present disclosure include but are not limited to this case, and the driver circuit may adopt other suitable structures.

In some examples, as illustrated in FIG. 9 and FIG. 11, a source electrode of the driver transistor T1, a drain electrode of the data writing transistor T2 and a drain electrode of the first light emission control transistor T4 are connected to a first node N1; a drain electrode of the driver transistor T1, a source electrode of the compensation transistor T3 and a source electrode of the second light emission control transistor T5 are connected to a second node N2; a gate electrode of the driver transistor T1, a drain electrode of the compensation transistor T3 and a drain electrode of the reset transistor T6 are connected to a third node N3.

In some examples, because the driver transistor T1, the data writing transistor T2, the first light emission control transistor T4, the second light emission control transistor T5 and the electrode reset transistor T7 need a higher mobility and a more stable source voltage, low-temperature polycrystalline silicon (LTPS) type transistors may be adopted, that is, materials of active layers of the driver transistor T1, the data writing transistor T2, the first light emission control transistor T4, the second light emission control transistor T5 and the electrode reset transistor T7 are low-temperature polycrystalline silicon.

In some examples, because the reset transistor T6 and the compensation transistor T3 need to have a lower leakage current, oxide type transistors may be used, that is, materials of active layers of the reset transistor T6 and the compensation transistor T3 are oxide semiconductors. In this case, the reset transistor T6 and the compensation transistor T1 can also better maintain the voltage stability of the storage capacitor.

FIG. 12A to FIG. 12E are schematic layout diagrams of a driver circuit of the light-emitting substrate provided by an embodiment of the present disclosure. The driver circuit illustrated in FIG. 12A to FIG. 12E is the same as that illustrated in FIG. 9.

Figure 12A:
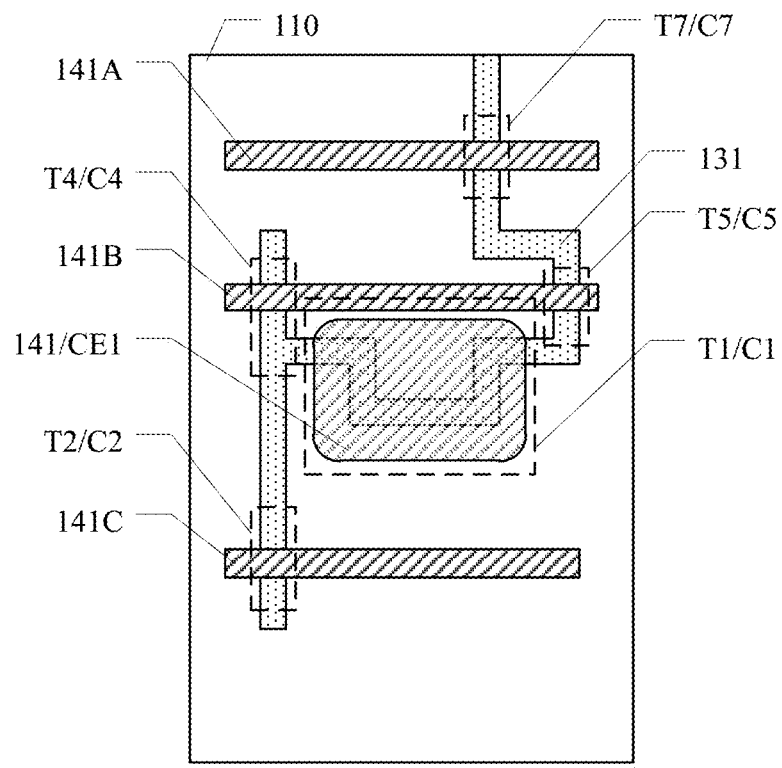
FIG. 12A to FIG. 12E are schematic layout diagrams of a driver circuit of a light-emitting substrate provided by an embodiment of the present disclosure.

As illustrated in FIG. 12A, the light-emitting substrate 100 includes a base substrate 110, a first semiconductor layer 131 and a first gate layer 141; the first semiconductor layer 131 is located on the base substrate 110, and the first gate layer 141 is located on a side of the first semiconductor layer 131 away from the base substrate. The first semiconductor layer 131 includes an active layer C1 of the driver transistor T1, an active layer C2 of the data writing transistor T2, an active layer C4 of the first light emission control transistor T4, an active layer C5 of the second light emission control transistor T5 and an active layer C7 of the electrode reset transistor T7. The first semiconductor layer 131 may be made of low-temperature polycrystalline silicon (LTPS), so that the driver transistor T1, the data writing transistor T2, the first light emission control transistor T4, the second light emission control transistor T5 and the electrode reset transistor T7 need a higher mobility and a more stable source voltage.

It should be noted that a first insulating layer 151 is disposed between the first semiconductor layer 131 and the first gate layer 141. In order to clearly show the relationship between the first semiconductor layer 131 and the first gate layer 141, the first insulating layer 151 is not illustrated in FIG. 12A; and the arrangement of the first insulating layer 151 can refer to FIG. 10A and FIG. 10B.

In some examples, the first semiconductor layer 131 is made of polysilicon, and a thickness of the first semiconductor layer 131 may range from 400 nm to 600 nm, such as 582 nm. The first gate layer 141 is made of metal molybdenum, and a thickness of the first gate layer 141 may range from 2000 nm to 4000 nm, for example, 2800 nm.

As illustrated in FIG. 12A, the first gate layer 141 includes a first reset signal line 141A, a light emission control line 141B, a first gate line 141C and a first electrode block CE1; the first reset signal line 141A, the light emission control line 141B, the first electrode block CE1 and the first gate line 141C may be arranged in sequence, and an orthographic projection of the first electrode block CE1 on the base substrate 110 is between an orthographic projection of the light emission control line 141B on the base substrate 110 and an orthographic projection of the first gate line 141C on the base substrate 110.

As illustrated in FIG. 12A, the first reset signal line 141A overlaps with the active layer C7 of the electrode reset transistor T7, that is, an orthographic projection of the first reset signal line 141A on the base substrate 110 overlaps with an orthographic projection of the active layer C7 of the electrode reset transistor T7 on the base substrate 110. The light emission control line 141B overlaps with both the active layer C4 of the first light emission control transistor T4 and the active layer C5 of the second light emission control transistor T5, that is, an orthographic projection of the light emission control line 141B on the base substrate 110 respectively overlaps with an orthographic projection of the active layer C4 of the first light emission control transistor T4 on the base substrate 110 and an orthographic projection of the active layer C5 of the second light emission control transistor T5 on the base substrate 110. The first gate line 141C overlaps with the active layer C2 of the data writing transistor T2, that is, an orthographic projection of the first gate line 141C on the base substrate 110 overlaps with an orthographic projection of the active layer C2 of the data writing transistor T2 on the base substrate 110.

As illustrated in FIG. 12A, a width-length ratio of a channel of the driver transistor T1 is larger than twice a width-length ratio of a channel of the data writing transistor T2, which is beneficial to reducing current fluctuation and improving the stability of the output current.

As illustrated in FIG. 12A, the source electrode of the driver transistor T1, the drain electrode of the data writing transistor T2 and the drain electrode of the first light emission control transistor T4 are connected in the first semiconductor layer 131; the drain electrode of the driver transistor T1 and the source electrode of the second light emission control transistor T5 are also connected in the first semiconductor layer 131.

Figure 12B:
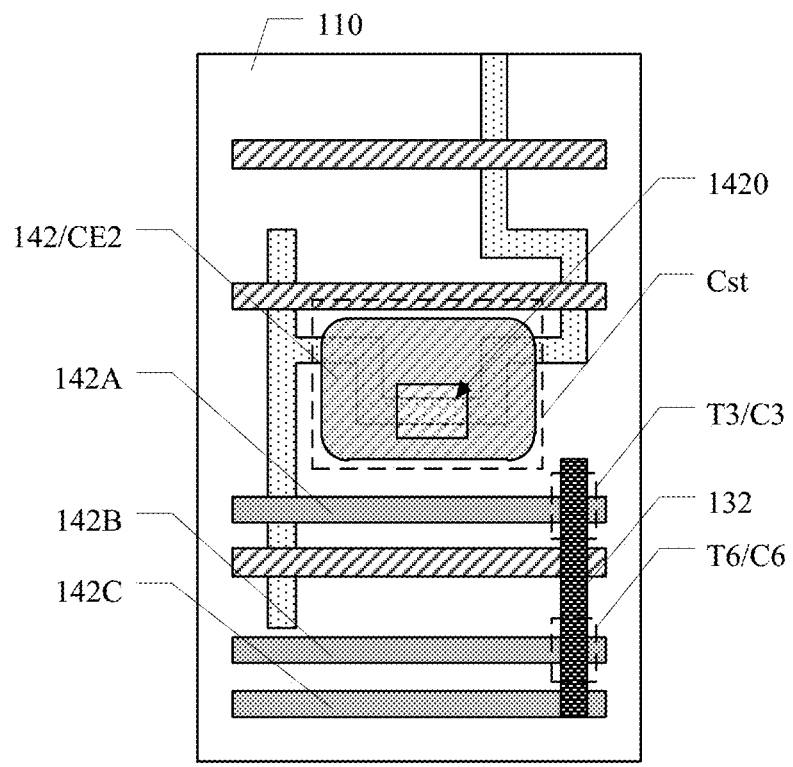

As illustrated in FIG. 12B, the light-emitting substrate 100 further includes a second gate layer 142 and a second semiconductor layer 132; the second gate layer 142 is located on a side of the first gate layer 141 away from the base substrate 110, and the second semiconductor layer 132 is located on a side of the second gate layer 142 away from the base substrate 110. The second semiconductor layer 132 may be made of an oxide semiconductor material, so that the reset transistor T6 and the compensation transistor T3 have a lower leakage current.

It should be noted that a second insulating layer 152 is disposed between the second semiconductor layer 132 and the second gate layer 142. In order to clearly show the relationship between the second semiconductor layer 132 and the second gate layer 142, the second insulating layer 152 is not illustrated in FIG. 12B; and the arrangement of the second insulating layer 152 can refer to FIG. 7.

In some examples, the second gate layer 142 may be made of metal molybdenum, and a thickness of the second gate layer 142 may range from 2000 nm to 4000 nm, for example, 3000 nm; the second semiconductor layer 132 is made of indium gallium zinc oxide (IGZO), and a thickness of the second semiconductor layer 132 may range from 300 nm to 600 nm, for example, 445 nm.

As illustrated in FIG. 12B, the second gate layer 142 includes a second electrode block CE2, a second gate line 142A, a second reset line 142B and a first initialization signal line 142C; the second electrode block CE2, the second gate line 142A, the second reset line 142B and the first initialization signal line 142C may be sequentially arranged. An orthographic projection of the second electrode block CE2 on the base substrate 110 and an orthographic projection of the second gate line 142A on the base substrate 110 are located between an orthographic projection of the light emission control line 141B on the base substrate 110 and an orthographic projection of the first gate line 141C on the base substrate 110; an orthographic projection of the second reset line 142B on the base substrate 110 and an orthographic projection of the first initialization signal line 142C on the base substrate 110 are located on a side of the orthographic projection of the first gate line 141C on the base substrate 110 away from the orthographic projection of the second gate line 142A on the base substrate 110.

As illustrated in FIG. 12B, the second semiconductor layer 132 includes the active layer C3 of the compensation transistor T3 and the active layer C6 of the reset transistor T6; the drain electrode of the compensation transistor T3 and the drain electrode of the reset transistor T6 are connected in the second semiconductor layer 132.

As illustrated in FIG. 12B, an orthographic projection of the second electrode block CE2 on the base substrate 110 overlaps with an orthographic projection of the first electrode block CE1 on the base substrate 110, so that the storage capacitor Cst can be formed. The second electrode block CE2 may be provided with an opening 1420 to expose a part of the first electrode block CE1. An orthographic projection of the opening 1420 on the base substrate 110 overlaps with an orthographic projection of the active layer C1 of the driver transistor T1 on the base substrate 110. The second gate line 142A overlaps with the active layer C3 of the compensation transistor T3, that is, an orthographic projection of the second gate line 142 on the base substrate 110 overlaps with an orthographic projection of the active layer C3 of the compensation transistor T3 on the base substrate 110. The second reset line 142B overlaps with the active layer C6 of the reset transistor T6, that is, an orthographic projection of the second reset line 142B on the base substrate 110 overlaps with an orthographic projection of the active layer C6 of the reset transistor T6 on the base substrate 110. The first initialization signal line 142C overlaps with the source electrode of the reset transistor T6, that is, an orthographic projection of the first initialization signal line 142C on the base substrate 110 overlaps with an orthographic projection of the source electrode of the reset transistor T6 on the base substrate 110.

Figure 12C:
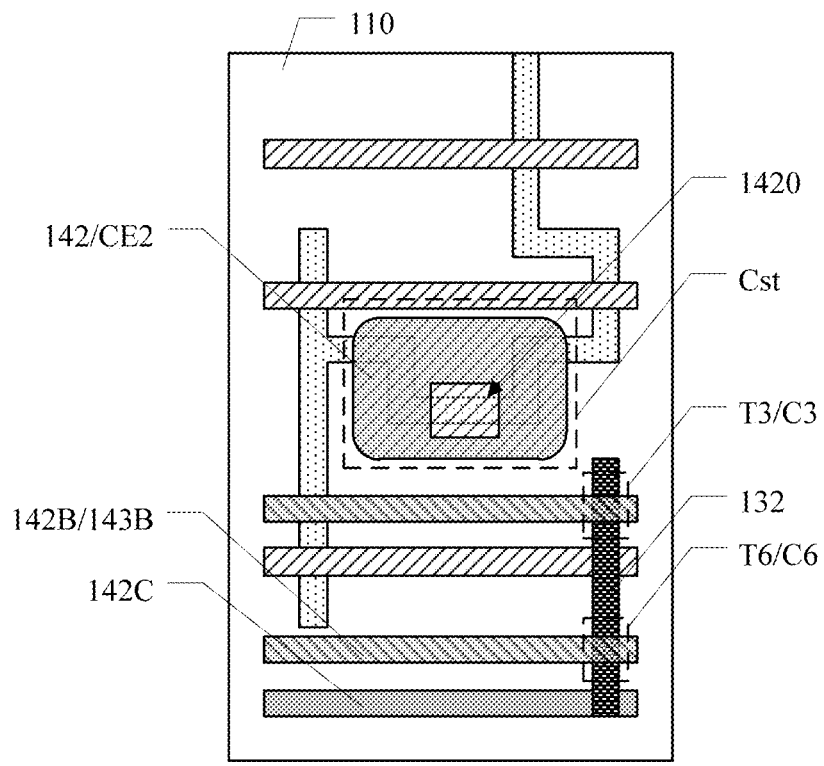

As illustrated in FIG. 12C, the light-emitting substrate 100 further includes a third gate layer 143 which is located on a side of the second semiconductor layer 132 away from the base substrate 110. It should be noted that a third insulating layer 153 is disposed between the second semiconductor layer 132 and the third gate layer 143. In order to clearly show the relationship between the second semiconductor layer 132 and the third gate layer 143, the third insulating layer 153 is not illustrated in FIG. 9C, and the arrangement of the third insulating layer 153 can refer to FIG. 10A and FIG. 10B.

In some examples, the third gate layer 143 may be a stack of metal molybdenum and titanium nitride, in which the titanium nitride is located on a side of the metal molybdenum close to the base substrate, and a thickness of the third gate layer 143 may range from 2000 nm to 4000 nm, for example, a thickness of the metal molybdenum is 2678 nm, and a thickness of the titanium nitride is 338 nm.

As illustrated in FIG. 12C, the third gate layer 143 includes a first auxiliary line 143A and a second auxiliary line 143B; an orthographic projection of the first auxiliary line 143A on the base substrate 110 overlaps with an orthographic projection of the active layer C3 of the compensation transistor T3 on the base substrate 110; an orthographic projection of the second auxiliary line 143B on the base substrate 110 overlaps with an orthographic projection of the active layer C6 of the reset transistor T6 on the base substrate 110. In this case, the first auxiliary line 143A and the second gate line 142A have a same potential, and the second auxiliary line 143B and the second reset signal line 142B have a same potential. Therefore, both the reset transistor T6 and the compensation transistor T3 have a double-gate structure, so that the leakage current thereof can be further reduced. Of course, the embodiments of the present disclosure include, but are not limited to this case, the reset transistor T6 and the compensation transistor T3 may not adopt the double-gate structure.

As illustrated in FIG. 12C, the orthographic projection of the first auxiliary line 143A on the base substrate 110 overlaps with the orthographic projection of the second gate line 142A on the base substrate 110; the orthographic projection of the second auxiliary line 143B on the base substrate 110 overlaps with the orthographic projection of the second reset line 142B on the base substrate 110.

Figure 12D:
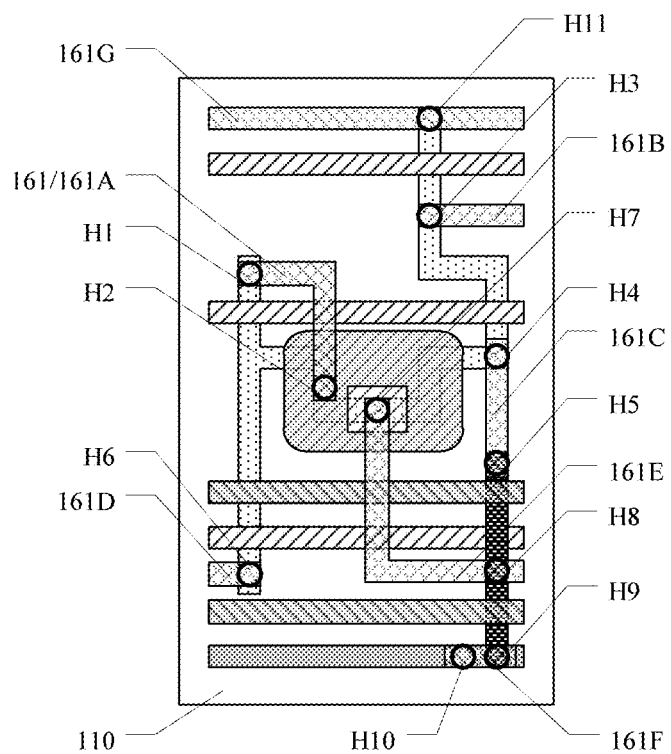

As illustrated in FIG. 12D, the light-emitting substrate 110 further includes a first conductive layer 161 which is located on a side of the third gate layer 143 away from the base substrate 110. It should be noted that the fourth insulating layer 154 is arranged between the third gate layer 143 and the first conductive layer 161. In order to clearly show the relationship between the first conductive layer 161 and the layers under the first conductive layer 161, the fourth insulating layer 154 is not illustrated in FIG. 12D, and the arrangement of the fourth insulating layer 154 can be referred to FIG. 10A and FIG. 10B.

In some examples, the first conductive layer 161 may be a stack of titanium/aluminum/titanium, and a thickness of first conductive layer 161 ranges from 5000 nm to 8000 nm; for example, a thickness of the two metal titanium sub-layers may respectively be 342 nm and 570 nm, and a thickness of the metal aluminum sub-layer may be 6026 nm.

As illustrated in FIG. 12D, the first conductive layer 161 includes a first connection block 161A, a second connection block 161B, a third connection block 161C, a fourth connection block 161D, a fifth connection block 161E, a sixth connection block 161F and a second initialization signal line 161G.

As illustrated in FIG. 12D, the first connection block 161A is electrically connected to the source electrode of the first light emission control transistor T4 through a first via hole H1, and is electrically connected to the second electrode block CE2 through the second via hole H2, so that the source electrode of the first light emission control transistor T4 can be connected to the second electrode block CE2.

As illustrated in FIG. 12D, the second connection block 161B is connected to the drain electrode of the second light emission control transistor T5 through a third via hole H3, and the second connection block 161B may be configured to connect with the first electrode 181 formed later, so as to apply the driving signal on the drain electrode of the second light emission control transistor T5 to the first electrode 181.

Because the number of layers of the driver circuit of the light-emitting substrate is large, compared with directly connecting the first electrode and the drain electrode of the second light emission control transistor through one via hole, the stability of the electrical connection between the first electrode and the drain electrode of the second light emission control transistor can be improved by arranging the second connection block, and the manufacturing difficulty of the via hole can be reduced.

As illustrated in FIG. 12D, the third connection block 161C is connected to the source electrode of the second light emission control transistor T5 through a fourth via hole H4 and is connected to the source electrode of the compensation transistor T3 through a fifth via hole H5, thereby connecting the source electrode of the second light emission control transistor T5 with the source electrode of the compensation transistor T3. Because the driver circuit adopts two kinds of semiconductor layers (that is the first semiconductor layer and the second semiconductor layer), the source electrode of the second light emission control transistor T5 can be connected to the source electrode of the compensation transistor T3 by arranging the third connection block.

As illustrated in FIG. 12D, the fourth connection block 161D is connected to the source electrode of the data writing transistor T2 through a sixth via hole H6, and the fourth connection block 161D can be configured to electrically connect the data line formed later, so as to connect the data line with the source electrode of the data writing transistor T2. Because the number of layers of the driver circuit of the light-emitting substrate is large, compared with directly connecting the data line with the source electrode of the data writing transistor through one via hole, the stability of the electrical connection between the data line and the source electrode of the data writing transistor can be improved by arranging the fourth connection block, and the manufacturing difficulty of the via hole can be reduced.

As illustrated in FIG. 12D, the fifth connection block 161E is connected to the first electrode block CE1 through a seventh via hole H7, and the fifth connection block 161E is connected to the drain electrode of the compensation transistor T3 and the source electrode of the reset transistor T6 through an eighth via hole H8, so that the first electrode block CE1 (which also serves as the gate electrode of the driver transistor T1), the drain electrode of the compensation transistor T3 and the source electrode of the reset transistor T6 can be electrically connected.

As illustrated in FIG. 12D, the sixth connection block 161F is connected to the source electrode of the reset transistor T6 through a ninth via hole H9, and is connected to the first initialization signal line 142C through a tenth via hole H10, so that the source electrode of the reset transistor T6 can be electrically connected to the first initialization signal line 142C.

As illustrated in FIG. 12D, the second initialization signal line 161G is connected to the source electrode of the electrode reset transistor T7 through an eleventh via hole H11, so that an initialization signal can be applied to the source electrode of the electrode reset transistor T7.

Figure 12E:
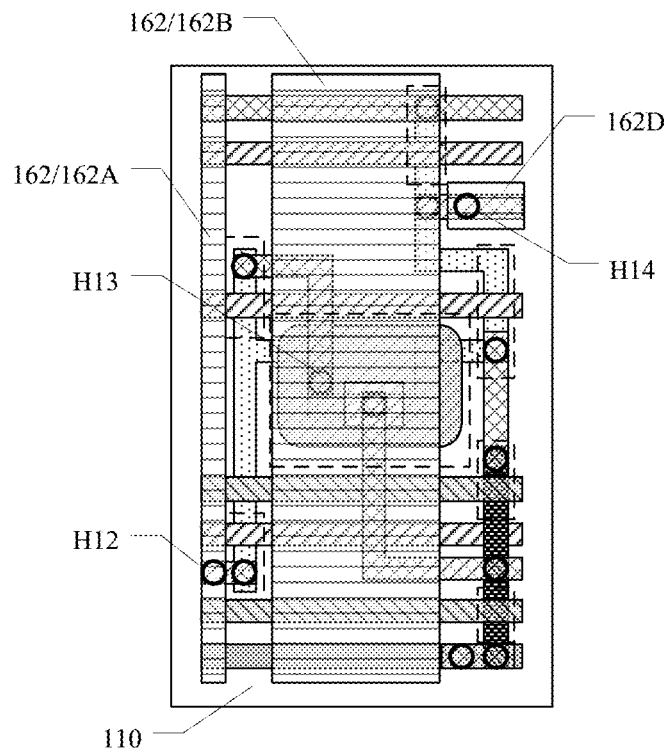

As illustrated in FIG. 12E, the light-emitting substrate 100 further includes a second conductive layer 162 which is located on a side of the first conductive layer 161 away from the base substrate 110. It should be noted that a fifth insulating layer 155 is arranged between the first conductive layer 161 and the second conductive layer 162. In order to clearly show the relationship between the second conductive layer 162 and the layers under the second conductive layer 162, the fifth insulating layer 155 is not illustrated in FIG. 12E, and the arrangement of the fifth insulating layer 155 can refer to FIG. 10A and FIG. 10B.

In some examples, the second conductive layer 162 may be a stack made of titanium/aluminum/titanium, a thickness of the second conductive layer 162 ranges from 5000 nm to 8000 nm; for example, a thickness of the metal titanium sub-layers may be 457 nm and 495 nm respectively, and a thickness of the metal aluminum sub-layer may be 6010 nm.

As illustrated in FIG. 12E, the second conductive layer 162 includes a data line 162A, a power line 162B and a connection electrode 162D. The data line 162A is connected to the fourth connection 161D through a twelfth via hole H12, so that the data line 162A is connected to the source electrode of the data writing transistor T2. The power line 162B is connected to the first connection block 161A through a thirteenth via hole H13, so that the power line 162B is connected to the source electrode of the first light emission control transistor T4 and the second electrode block CE2.

As illustrated in FIG. 12E, a size of the power line 162B in a direction perpendicular to an extension direction of the data line 162A is five times larger than a size of the data line 162A in a direction perpendicular to the extension direction of the data line 162A, so that the resistance of the power line 162B can be reduced. In addition, because a width of the power supply line 162B is wide, the power supply line 162B can also play a role of reflecting laser light in the subsequent process of forming the light-emitting diode. On the other hand, because a certain high temperature will be generated during the process of forming or bonding the light-emitting diode, the power line 162B can also protect the layers under the power line 162B.

As illustrated in FIG. 12E, the connection electrode 162D is connected to the second connection block 161B through a fourteenth via hole H14. The connection electrode 162D can be configured to connect with the first electrode 181 formed later, so that the driving signal on the drain electrode of the second light emission control transistor T5 is applied to the first electrode 181 through the second connection block 161B and the connection electrode 162D. Because of the number of the layers of the driver circuit in the light-emitting substrate is large, compared with directly connecting the first electrode and the drain electrode of the second light emission control transistor through a via hole, the stability of the electrical connection between the first electrode and the drain electrode of the second light emission control transistor can be further improved by arranging the second connection block and the connection electrode, and the manufacturing difficulty of the via hole is reduced.

In some examples, as illustrated in FIG. 12E, an orthographic projection of the power line 162B on the base substrate 110 overlaps with an orthographic projection of the first connection block 161A on the base substrate 110, and an overlapping area of the two may be greater than 80% of an area of the orthographic projection of the first connection block 161A on the base substrate 110. Therefore, the power line 162B can protect the first connection block 161A in the subsequent process of forming or bonding the light-emitting diode.

In some examples, as illustrated in FIG. 12E, the orthographic projection of the power line 162B on the base substrate 110 overlaps with an orthographic projection of the fifth connection block 161E on the base substrate 110, and an overlapping area of the two may be greater than 70% of an area of the orthographic projection area of the fifth connection block 161E on the base substrate 110. Therefore, the power line 162B can protect the fifth connection block 161E in the subsequent process of forming or bonding the light-emitting diode.

In some examples, as illustrated in FIG. 12E, the orthographic projection of the power line 162B on the base substrate 110 overlaps with the orthographic projection of the first electrode block CE1 on the base substrate 110 or the second electrode block CE2 on the base substrate 110, and an overlapping area of the orthographic projection of the power line 162B on the base substrate 110 and the orthographic projection of the first electrode block CE1 on the base substrate 110 or an overlapping area of the orthographic projection of the power line 162B on the base substrate 110 and the orthographic projection of the second electrode block CE2 on the base substrate 110 may be greater than 70% of the area of the orthographic projection of the first electrode block CE1 on the base substrate 110. Therefore, the power line 162B can protect the first electrode block CE1 in the subsequent process of forming or bonding the light-emitting diode.

In some examples, as illustrated in FIG. 12E, the orthographic projection of the power line 162B on the base substrate 110 overlaps with an orthographic projection of the active layer of the driver transistor T1 on the base substrate 110, and an overlapping area of the two may be greater than 90% of an area of the orthographic projection of the active layer of the driver transistor T1 on the base substrate 110. Therefore, the power line 162B can play a role of protecting the active layer of the driver transistor T1 in the subsequent process of forming or bonding the light-emitting diode. In addition, during the use of the light-emitting substrate, the power line 162B can also play a role of shielding light, thereby preventing the light from adversely affecting the active layer of the driver transistor T1.

In some examples, as illustrated in FIG. 12E, the orthographic projection of the power line 162B on the base substrate 110 overlaps with an orthographic projection of the active layer of the electrode reset transistor T7 on the base substrate 110, and an overlapping area of the two may be greater than 90% of an area of the orthographic projection of the active layer of the electrode reset transistor T7 on the base substrate 110. Therefore, the power line 162B can protect the active layer of the electrode reset transistor T7 in the subsequent process of forming or bonding the light-emitting diode. In addition, during the use of the light-emitting substrate, the power line 162B can also play a role of shielding light, thereby preventing the light from adversely affecting the active layer of the electrode reset transistor T7.

Figure 13:
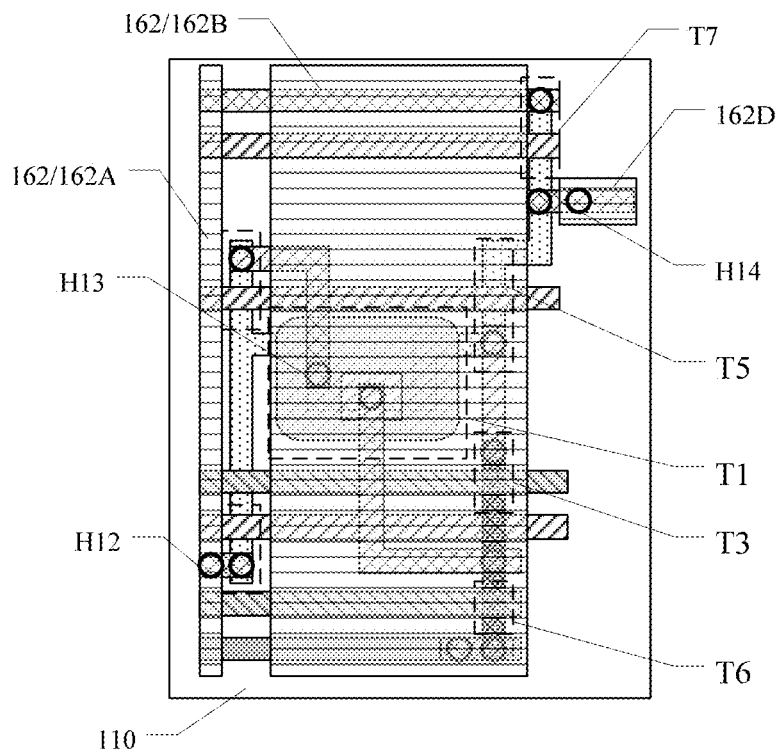
FIG. 13 is a schematic planar view of further another light-emitting substrate provided by an embodiment of the present disclosure.

FIG. 13 is a schematic planar view of further another light-emitting substrate provided by an embodiment of the present disclosure. As illustrated in FIG. 13, a shortest distance between an orthographic projection of a connection part which connects the drain electrode of the second control transistor T5 and the drain electrode of the reset transistor T7 on the base substrate 110 and an orthographic projection of the data line 162A on the base substrate 110 is greater than a shortest distance between an orthographic projection of the active layer of the compensation transistor T3 on the base substrate 110 and the orthographic projection of the data line 162A on the base substrate 110, that is, compared with the active layer of the compensation transistor T3, the distance between the connection part which connects the drain electrode of the second control transistor T5 and the drain electrode of the reset transistor T7 and the data line 162A is larger. Therefore, a connection electrode that is configured to be connected to the first electrode 181 and is to be formed later can be arranged at a larger distance from the data line 162A, and in this case, the width of the power line 162B can be further increased, thus covering a larger area and having a better protection function.

In some examples, as illustrated in FIG. 13, the orthographic projection of the power line 162B on the base substrate 110 overlaps with the orthographic projection of the first connection block 161A on the base substrate 110, and an overlapping area of the two may be greater than 80% of the area of the orthographic projection of the first connection block 161A on the base substrate 110. Therefore, the power line 162B can protect the first connection block 161A in the subsequent process of forming or bonding the light-emitting diode.

In some examples, as illustrated in FIG. 13, the orthographic projection of the power line 162B on the base substrate 110 overlaps with the orthographic projection of the fifth connection block 161E on the base substrate 110, and an overlapping area of the two may be greater than 90% the area of the orthographic projection area of the fifth connection block 161E on the base substrate 110. Therefore, the power line 162B can protect the fifth connection block 161E in the subsequent process of forming or bonding the light-emitting diode.

In some examples, as illustrated in FIG. 13, the orthographic projection of the power line 162B on the base substrate 110 completely covers the orthographic projection of the first electrode block CE1 on the base substrate 110 or the orthographic projection of the second electrode block CE2 on the base substrate 110, that is, an overlapping area of the orthographic projection of the power line 162B on the base substrate 110 and the orthographic projection of the first electrode block CE1 on the base substrate 110 or an overlapping area of the orthographic projection of the power line 162B on the base substrate 110 and the orthographic projection of the second electrode block CE2 on the base substrate 110 may be 100% of the orthographic projection area of the first electrode block CE1 on the base substrate 110. Therefore, the power line 162B can protect the first electrode block CE1 in the subsequent process of forming or bonding the light-emitting diode.

In some examples, as illustrated in FIG. 13, the orthographic projection of the power line 162B on the base substrate 110 completely covers the orthographic projection of the active layer of the driver transistor T1 on the base substrate 110, that is, an overlapping area of the two may be 100% of the orthographic projection area of the active layer of the driver transistor T1 on the base substrate 110. Therefore, the power line 162B can play a role of protecting the active layer of the driver transistor T1 in the subsequent process of forming or bonding the light-emitting diode. In addition, during the use of the light-emitting substrate, the power line 162B can also play a role of shielding light, thereby preventing the light from adversely affecting the active layer of the driver transistor T1.

In some examples, as illustrated in FIG. 13, the orthographic projection of the power line 162B on the base substrate 110 covers the orthographic projection of the active layer of the compensation transistor T3 on the base substrate 110 and an orthographic projection of the active layer of the reset transistor T6 on the base substrate 110. Therefore, the power line 162B can protect the active layer of the anode compensation transistor T3 and the active layer of the reset transistor T6 in the subsequent process of forming or bonding the light-emitting diode. In addition, during the use of the light-emitting substrate, the power line 162B can also play a role of shielding light, thereby preventing the light from adversely affecting the active layer of the compensation transistor T3 and the active layer of the reset transistor T6.

An operation mode of the driver circuit illustrated in FIG. 11 and FIG. 12A to FIG. 12E will be schematically described below. First, when the reset signal is transmitted to the first reset signal line 141A and the electrode reset transistor T7 is turned on, a residual current flowing through the first electrode of each subpixel is discharged through the electrode reset transistor T7, so that the light emission caused by the residual current flowing through the anode of each subpixel can be suppressed. Then, when a reset signal is transmitted to the second reset signal line 142B and an initialization signal is transmitted to the first initialization signal line 142C, the reset transistor T6 is turned on, and an initialization voltage Vint is applied to the gate electrode of the driver transistor T1 and the first electrode block CE1 of the storage capacitor Cst through the reset transistor T6, so that the gate electrode of the driver transistor T1 and the storage capacitor Cst are initialized. The initialization of the gate electrode of the driver transistor T1 can turn on the first thin film transistor T1.

Then, when a gate signal is transmitted to the first gate line 141C and a data signal is transmitted to the data line 162A, the data writing transistor T2 is turned on; the gate signal is transmitted to the second gate line 142A, the compensation thin film transistor T3 is turned on, and a data voltage Vd is applied to the gate electrode of the driver transistor T1 through the data writing transistor T2 and the compensation thin film transistor T3. In this case, the voltage applied to the gate electrode of the driver transistor T1 is a compensation voltage Vd+Vth, and the compensation voltage applied to the gate electrode of the driver transistor T1 is also applied to the first electrode block CE1 of the storage capacitor Cst.

Subsequently, the power supply line 162B applies a driving voltage Vel to the second electrode block CE2 of the storage capacitor Cst, and applies the compensation voltage Vd+Vth to the first electrode block CE1, so that charges corresponding to the difference between the voltages respectively applied to the two electrodes of the storage capacitor Cst are stored in the storage capacitor Cst, and the driver transistor T1 is turned on after a predetermined time.

Subsequently, when an emission control signal is applied to the emission control line 141B, both the first emission control transistor T4 and the second emission control transistor T5 are turned on, so that the first emission control transistor T4 and the second emission control transistor T5 apply the driving voltage Vel. When the driving voltage Vel passes through the driver transistor T1 turned on by the storage capacitor Cst, the difference between the corresponding driving voltage Vel and the voltage applied to the gate electrode of the driver transistor T1 through the storage capacitor Cst enable a driving current Id flows through the drain electrode of the driver transistor T1, and the driving current Id is applied to the first electrode 181 of each sub-pixel through the second light emission control transistor T5, so that the light-emitting layer of each sub-pixel emits light.

It should be noted that the above-mentioned operation mode of the driver circuit is only one possible driving mode of the driver circuit, and the embodiments of the present disclosure include but are not limited to this.

In some examples, materials of the first insulating layer, the second insulating layer, the third insulating layer and the fourth insulating layer may be one selected from a group consisting of silicon nitride, silicon oxide and silicon oxynitride or a stack of at least two selected from a group consisting of silicon nitride, silicon oxide and silicon oxynitride.

Figure 14A:
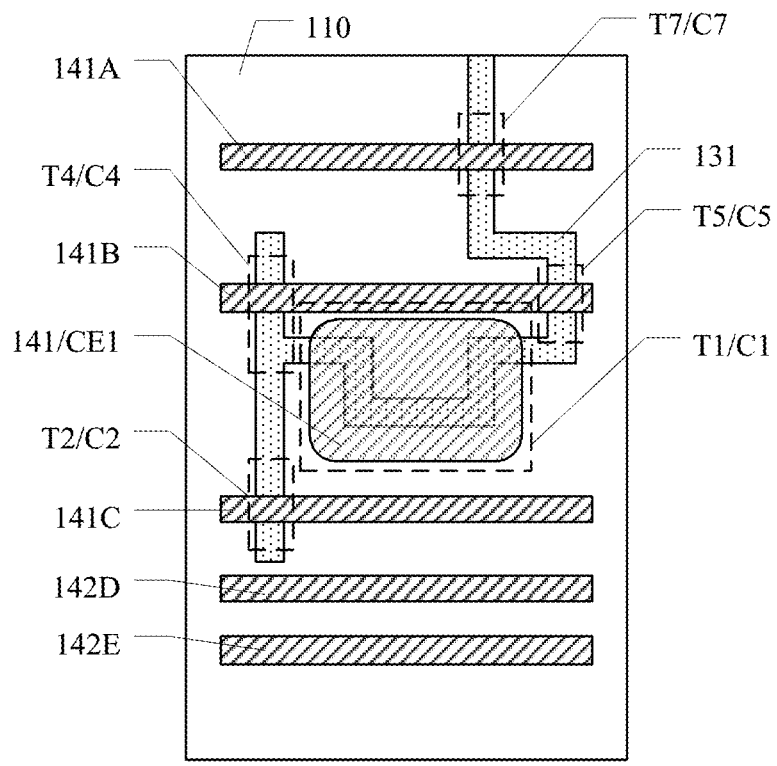
FIG. 14A to FIG. 14C are schematic layout diagrams of a driver circuit of another light-emitting substrate provided by an embodiment of the present disclosure.
Figure 14B:
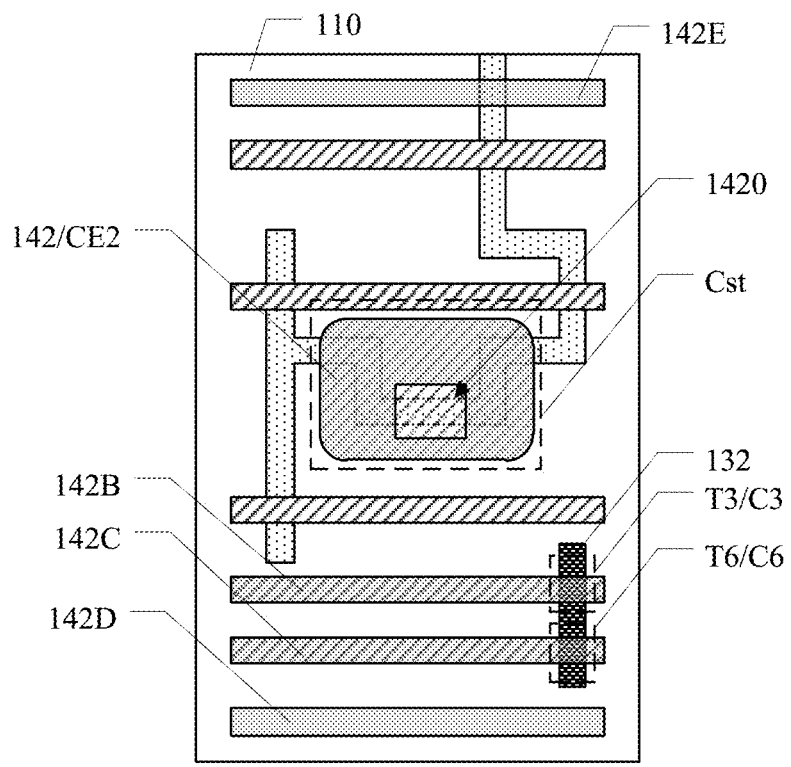
Figure 14C:
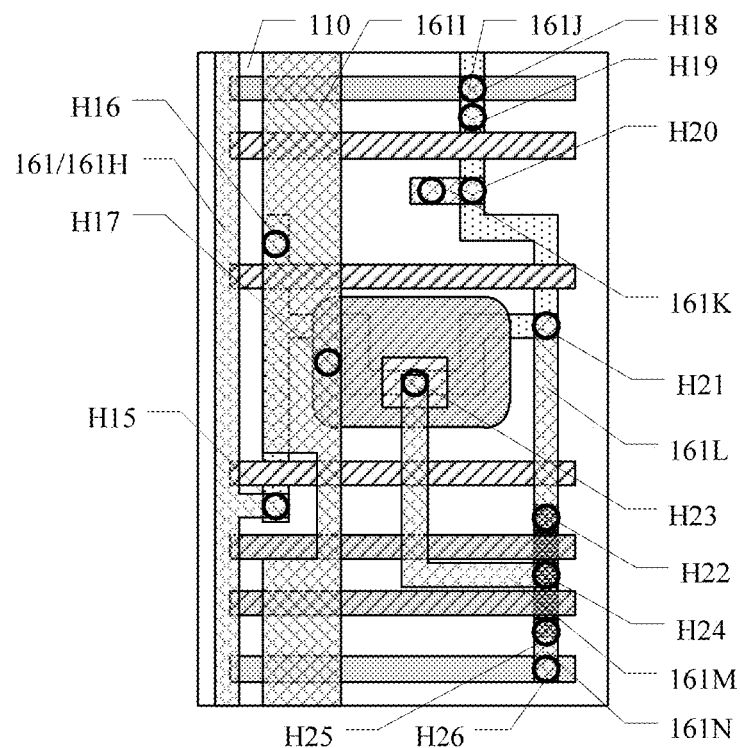

FIG. 14A to FIG. 14C are schematic layout diagrams of a driver circuit of another light-emitting substrate provided by an embodiment of the present disclosure.

As illustrated in FIG. 14A, the light-emitting substrate 100 includes a base substrate 110, a first semiconductor layer 131 and a first gate layer 141; the first semiconductor layer 131 is located on the base substrate 110, and the first gate layer 141 is at a side of the first semiconductor layer 131 away from the base substrate. The first semiconductor layer 131 includes an active layer C1 of the driver transistor T1, an active layer C2 of the data writing transistor T2, an active layer C4 of the first light emission control transistor T4, an active layer C5 of the second light emission control transistor T5 and an active layer C7 of the electrode reset transistor T7. The first semiconductor layer 131 may be made of low-temperature polycrystalline silicon (LTPS) material, so that the driver transistor T1, the data writing transistor T2, the first light emission control transistor T4, the second light emission control transistor T5 and the electrode reset transistor T7 have a higher mobility and a more stable source voltage.

In some examples, the first semiconductor layer 131 is made of polysilicon, and a thickness of the first semiconductor layer 131 may range from 400 nm to 600 nm, such as 582 nm. The first gate layer 141 is made of metal molybdenum, and a thickness of the first gate layer 141 may range from 2000 nm to 4000 nm, for example, 2800 nm.

As illustrated in FIG. 14A, the first gate layer 141 includes a first reset signal line 141A, a light emission control line 141B, a first gate line 141C, a first electrode block CE1, a second gate line 141D and a second reset line 141E; the first reset signal line 141A, the light emission control line 141B, the first electrode block CE1, the first gate line 141C, the second gate line 141D and the second reset line 141E may be arranged in sequence along a direction perpendicular to the first reset signal line 141, and an orthographic projection of the first electrode block CE1 on the base substrate 110 is between an orthographic projection of the light emission control line 141B on the base substrate 110 and an orthographic projection of the first gate line 141C on the base substrate 110; an orthographic projection of the second gate line 141D on the base substrate 110 and an orthographic projection of the second reset line 141E on the base substrate 110 are at a side of the orthographic projection of the first gate line 141C on the base substrate 110 away from the light emission control line 141B.

As illustrated in FIG. 14A, the first reset signal line 141A overlaps with the active layer C7 of the electrode reset transistor T7, that is, an orthographic projection of the first reset signal line 141A on the base substrate 110 overlaps with an orthographic projection of the active layer C7 of the electrode reset transistor T7 on the base substrate 110. The light emission control line 141B overlaps with the active layer C4 of the first light emission control transistor T4 and the active layer C5 of the second light emission control transistor T5, that is, an orthographic projection of the light emission control line 141B on the base substrate 110 respectively overlaps with an orthographic projection of the active layer C4 of the first light emission control transistor T4 on the base substrate 110 and an orthographic projection of the active layer C5 of the second light emission control transistor T5 on the base substrate 110. The first gate line 141C overlaps with the active layer C2 of the data writing transistor T2, that is, an orthographic projection of the first gate line 141C on the base substrate 110 overlaps with an orthographic projection of the active layer C2 of the data writing transistor T2 on the base substrate 110.

As illustrated in FIG. 14A, a width-length ratio of a channel of the driver transistor T1 is larger than twice a width-length ratio of a channel of the data writing transistor T2, which is beneficial to reducing current fluctuation and improving the stability of the output current.

As illustrated in FIG. 14A, the source electrode of the driver transistor T1, the drain electrode of the data writing transistor T2 and the drain electrode of the first light emission control transistor T4 are connected in the first semiconductor layer 131; the drain electrode of the driver transistor T1 and the source electrode of the second light emission control transistor T5 are also connected in the first semiconductor layer 131.

As illustrated in FIG. 14B, the light-emitting substrate 100 further includes a second gate layer 142 and a second semiconductor layer 132; the second semiconductor layer 132 is on a side of the first gate layer 141 away from the base substrate 110, and the second gate layer 142 is on a side of the second semiconductor layer 132 away from the base substrate 110. The second semiconductor layer 132 may be made of an oxide semiconductor material, so that both the reset transistor T6 and the compensation transistor T3 have a lower leakage current.

In some examples, the second gate layer 142 may be made of metal molybdenum, and a thickness of the second gate layer 142 may range from 2000 nm to 4000 nm, for example, 3000 nm; the second semiconductor layer 132 is made of indium gallium zinc oxide (IGZO), and a thickness of the second semiconductor layer 132 may range from 300 nm to 600 nm, for example, 445 nm.

As illustrated in FIG. 14B, the second semiconductor layer 132 includes an active layer C3 of the compensation transistor T3 and an active layer C6 of the reset transistor T6; the drain electrode of the compensation transistor T3 and the drain electrode of the reset transistor T6 are connected in the second semiconductor layer 132. An orthographic projection of the second semiconductor layer 132 on the base substrate 110 respectively overlaps with the orthographic projection of the second gate line 141D and the orthographic projection of the second reset line 141E on the base substrate 110, so that the active layer C3 of the compensation transistor T3 and the active layer C6 of the reset transistor T6 can be defined.

As illustrated in FIG. 14B, the second gate layer 142 includes a second electrode block CE2, a third auxiliary line 142B, a fourth auxiliary line 142C, a first initialization signal line 142D and a second initialization signal line 142E; the second electrode block CE2, the third auxiliary line 142B, the fourth auxiliary line 142C and the first initialization signal line 142D may be sequentially arranged along a direction perpendicular to an extending direction of the first initialization signal line 142D. An orthographic projection of the second electrode block CE2 on the base substrate 110 is located between the orthographic projection of the light emission control line 141B and an orthographic projection of the first gate line 141C on the base substrate 110.

As illustrated in FIG. 14B, an orthographic projection of the third auxiliary line 142B on the base substrate 110 overlaps with an orthographic projection of the active layer C3 of the compensation transistor T3 on the base substrate 110, thus forming a double-gate structure of the compensation transistor T3 with the second gate line 141D; an orthographic projection of the fourth auxiliary line 142C on the base substrate 110 overlaps with an orthographic projection of the active layer C6 of the reset transistor T6 on the base substrate 110, so that the fourth auxiliary line 142C and the second reset line 141E can form a double-gate structure of the reset transistor T6, thereby further reducing the leakage current of the compensation transistor T3 and the reset transistor T6.

As illustrated in FIG. 14B, the orthographic projection of the third auxiliary line 142B on the base substrate 110 overlaps with an orthographic projection of the second gate line 141D on the base substrate 110, or even completely overlaps with the orthographic projection of the second gate line 141D on the base substrate 110; an orthographic projection of the fourth auxiliary line 142C on the base substrate 110 overlaps with an orthographic projection of the second reset line 141E on the base substrate 110, or even completely overlaps with the orthographic projection of the second reset line 141E on the base substrate 110.

As illustrated in FIG. 14B, the orthographic projection of the second electrode block CE2 on the base substrate 110 overlaps with the orthographic projection of the first electrode block CE1 on the base substrate 110, so that the storage capacitor Cst can be formed. The second electrode block CE2 may be provided with an opening 1420 to expose a part of the first electrode block CE1. An orthographic projection of the opening 1420 on the base substrate 110 overlaps with an orthographic projection of the active layer C1 of the driver transistor T1 on the base substrate 110.

It should be noted that, compared with the driver circuit illustrated in FIG. 12A to FIG. 12E, the pixel driver circuit illustrated in FIG. 14A to FIG. 14E does not need to be provided with a third gate layer, so that a mask process can be omitted and materials can be saved and the cost can be further reduced.

As illustrated in FIG. 14C, the light-emitting substrate 100 further includes a first conductive layer 161 which is located on a side of the second gate layer 142 away from the base substrate 110. The first conductive layer 161 includes a data line 161H, a power line 161I, a seventh connection block 161J, an eighth connection block 161K, a ninth connection block 161L, a tenth connection block 161M and an eleventh connection block 161N.

As illustrated in FIG. 14C, the data line 161H includes an extension part and a protrusion part protruding from the extension part, and the protrusion part is connected to the source electrode of the data writing transistor T2 through a fifteenth via hole H15. An orthographic projection of the power line 161I on the base substrate 110 respectively overlaps with an orthographic projection of the source electrode of the light emission control transistor T4 on the base substrate and the orthographic projection of the second electrode block CE2 on the base substrate 110, and can be connected to the source electrode of the light emission control transistor T4 through a sixteenth via hole H16 and connected to the second electrode block CE2 through a seventeenth via hole H17.

For example, as illustrated in FIG. 14C, the power line 161I has a hollow at a position where the source electrode of the data writing transistor T2 is located, so that it is convenient for the protrusion part to be connected to the source electrode of the data writing transistor T2 through the fifteenth via hole H15.

As illustrated in FIG. 14C, an orthographic projection of the seventh connection block 161J on the base substrate 110 respectively overlaps with an orthographic projection of the source electrode of the electrode reset transistor T7 on the base substrate 110 and an orthographic projection of the second initialization signal line 142E on the base substrate 110, and can be connected to the second initialization signal line 142E through an eighteenth via hole H18 and connected to the source electrode of the electrode reset transistor T7 through a nineteenth via hole H19.

As illustrated in FIG. 14C, an orthographic projection of the eighth connection block 161K on the base substrate 110 overlaps with an orthographic projection of the drain electrode of the second light emission control transistor T5 on the base substrate 110, and can be connected to the drain electrode of the second light emission control transistor T5 through a twentieth via hole H20.

As illustrated in FIG. 14C, an orthographic projection of the ninth connection block 161L on the base substrate 110 respectively overlaps with an orthographic projection of the source electrode of the second light emission control transistor T5 and an orthographic projection of the source electrode of the compensation thin film transistor T3 on the base substrate 110, and can be connected to the source electrode of the light emission control transistor T5 through a twenty-first via hole H21 and the source electrode of the compensation thin film transistor T3 through a twenty-second via hole H22.

As illustrated in FIG. 14C, an orthographic projection of the tenth connection block 161M on the base substrate 110 overlaps with the orthographic projection of the opening 1420 of the second electrode block CE2 on the base substrate 110 and an orthographic projection of the drain electrode of the compensation transistor T3 on the base substrate 110, respectively, and can be connected to the first electrode block CE1 through a twenty-third via hole H23 and connected to the drain electrode of the compensation transistor T3 through a twenty-fourth via hole H24.

For example, as illustrated in FIG. 14C, a shape of an orthographic projection of the tenth connection block 161M on the base substrate may be L-shaped. Of course, embodiments of the present disclosure include but are not limited to this case.

As illustrated in FIG. 14C, an orthographic projection of the eleventh connection block 161N on the base substrate 110 respectively overlaps with an orthographic projection of the source electrode of the reset transistor T6 on the base substrate 110 and an orthographic projection of the first initialization signal line 142D on the base substrate 110, and can be connected to the source electrode of the reset transistor T6 through a twenty-fifth via hole H25 and connected to the first initialization signal line 142D through a twenty-sixth via hole H26.

It should be noted that, compared with the driver circuit illustrated in FIG. 12A to FIG. 12E, the first conductive layer in the pixel driver circuit illustrated in FIG. 14A to FIG. 14E integrates the function of the second conductive layer, therefore it is not required to provide the second conductive layer, thereby omitting a mask process and saving materials and thus further reducing the cost.

In some examples, the first conductive layer 161 may be a stack of titanium/aluminum/titanium, and a thickness of the first conductive layer 161 may range from 5000 nm to 8000 nm; for example, thicknesses of the two titanium metal sub-layer may respectively be 342 nm and 570 nm, and a thickness of the aluminum metal sub-layer may be 6026 nm.

Figure 15:
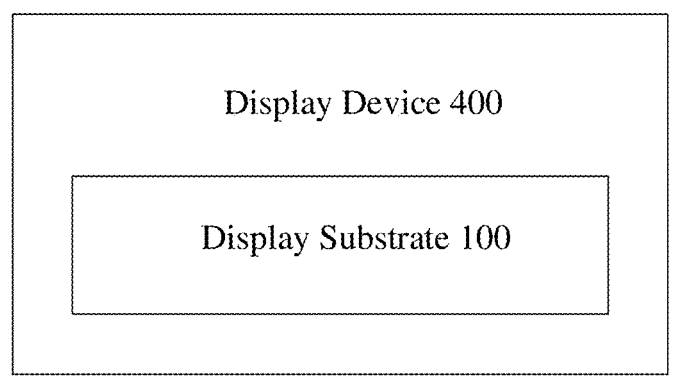
FIG. 15 is a schematic diagram of a display device provided by an embodiment of the present disclosure.

An embodiment of the present disclosure further provides a display device. FIG. 15 is a schematic diagram of a display device provided by an embodiment of the present disclosure. As illustrated in FIG. 15, the display device 400 includes any one of the above-mentioned display substrates 100. Therefore, the display device has beneficial effects corresponding to those of the display substrate. For example, the display device can ensure the bonding success rate of the light-emitting substrate, thereby improving the product yield of the light-emitting substrate. On the other hand, because the second openings correspond to the bonding pads, the contact resistance and current loss can be reduced, so that the stability and accuracy of the light-emitting current of the light-emitting diode can be ensured, and the display quality of the light-emitting substrate can be improved.

For example, the display device can be a TV, a computer, a notebook computer, a tablet computer, a mobile phone, a navigator, an electronic photo frame and other electronic products with display function.

The following statements should be noted:
(1) The accompanying drawings involve only the structure(s) in connection with the embodiment(s) of the present disclosure, and other structure(s) can be referred to common design(s).
(2) In case of no conflict, the features in a same embodiment and different embodiments of the present disclosure can be combined with each other.

What have been described above are only specific implementations of the present disclosure, the protection scope of the present disclosure is not limited thereto, and the protection scope of the present disclosure should be based on the protection scope of the claims.

What is claimed is:
1. A light-emitting substrate, comprising:
   a base substrate;
   an electrode layer, at a side of the base substrate;
   a definition pattern layer, at a side of the electrode layer away from the base substrate: and
   a driver circuit layer, between the base substrate and an electrode flat layer;
   wherein the electrode layer comprises a first electrode, the definition pattern layer at least covers a part of the first electrode, and the definition pattern layer comprises a plurality of first openings, and the plurality of first openings expose a same first electrode; the driving circuit layer comprises a plurality of driver circuits, each of the driver circuits comprises a driver transistor, a data writing transistor, a first light emission control transistor a second light emission control transistor, an electrode reset transistor, a reset transistor and a compensation transistor, a material of active layers of the driver transistor, the data writing transistor, the first light emission control transistor, the second light emission control transistor and the electrode reset transistor is low-temperature polycrystalline silicon, and a material of active layers of the reset transistor and the compensation transistor is an oxide semiconductor.

2. The light-emitting substrate according to claim 1, wherein the electrode layer further comprises a second electrode, the first electrode and the second electrode are insulated from each other and are spaced apart from each other, the definition pattern layer covers a part of the second electrode, and the definition pattern layer further comprises at least one second opening, and the at least one second opening exposes a same second electrode.

3. The light-emitting substrate according to claim 2, wherein orthographic projections of the first openings on the base substrate are within an orthographic projection of the same first electrode on the base substrate, and an orthographic projection of the at least one second opening on the base substrate is within an orthographic projection of the same second electrode on the base substrate.

4. The light-emitting substrate according to claim 3, wherein a size of the first electrode in a first direction is larger than a size of the first electrode in a second direction, the second direction is perpendicular to the first direction, and the plurality of first openings are arranged along the first direction.

5. The light-emitting substrate according to claim 2, wherein the at least one second opening comprises a plurality of second openings.

6. The light-emitting substrate according to claim 5, wherein a size of the first electrode in a first direction is larger than a size of the first electrode in a second direction, the second direction is perpendicular to the first direction, and the plurality of first openings are arranged along the first direction.

7. The light-emitting substrate according to claim 2, wherein a size of the first electrode in a first direction is larger than a size of the first electrode in a second direction, the second direction is perpendicular to the first direction, and the plurality of first openings are arranged along the first direction.

8. The light-emitting substrate according to claim 2, further comprising:
a light-emitting diode, at a side of the definition pattern layer away from the base substrate,
wherein the light-emitting diode comprises a third electrode and a fourth electrode, the third electrode comprises a plurality of third sub-electrodes, the plurality of third sub-electrodes are connected to the first electrode through the plurality of first openings, and the fourth electrode is connected to the second electrode.

9. The light-emitting substrate according to claim 8, wherein the fourth electrode of the light-emitting diode comprises a plurality of fourth sub-electrodes.

10. The light-emitting substrate according to claim 7, wherein the light-emitting diode further comprises:
a first semiconductor layer, comprising a first region and a second region, wherein the fourth electrode is in the second region;
a light-emitting layer, in the first region; and
a second semiconductor layer, at a side of the light-emitting layer away from the first semiconductor layer,
wherein the third electrode is at a side of the second semiconductor layer away from the light-emitting layer.

11. The light-emitting substrate according to claim 1, wherein a material of the definition pattern layer comprises an insulation material.

12. The light-emitting substrate according to claim 1, wherein the electrode layer comprises a plurality of first electrodes, and the plurality of driver circuits are electrically connected to the plurality of first electrodes.

13. The light-emitting substrate according to claim 12, wherein a width-length ratio of a channel of the driver transistor is twice greater than a width-length ratio of a channel of the data writing transistor.

14. The light-emitting substrate according to claim 12, wherein the reset transistor and the compensation transistor adopt a double-gate structure.

15. The light-emitting substrate according to claim 12, wherein the driver circuit further comprises a data line and a power line, and a width of the power line is five times greater than a width of the data line.

16. The light-emitting substrate according to claim 15, wherein an orthographic projection of the power line on the base substrate at least partially overlaps an orthographic projection of the driver transistor on the base substrate.

17. The light-emitting substrate according to claim 16, wherein the orthographic projection of the power line on the base substrate at least partially overlaps an orthographic projection of the electrode reset transistor on the base substrate.

18. The light-emitting substrate according to claim 15, wherein an orthographic projection of the power line on the base substrate at least partially overlaps an orthographic projection of the compensation transistor and an orthographic projection of the reset transistor on the base substrate.

19. A display device, comprising the light-emitting substrate according to claim 1.

* * * * *

UNITED STATES PATENT AND TRADEMARK OFFICE
CERTIFICATE OF CORRECTION

| | | |
|---|---|---|
| PATENT NO. | : 12,211,859 B2 | Page 1 of 1 |
| APPLICATION NO. | : 17/641557 | |
| DATED | : January 28, 2025 | |
| INVENTOR(S) | : Chunping Long et al. | |

It is certified that error appears in the above-identified patent and that said Letters Patent is hereby corrected as shown below:

In the Claims

Column 24, Lines 41-42, that portion of the sentence reading:
"...a first light emission control transistor a second light emission control transistor..."
Should read:
--a first light emission control transistor, a second light emission control transistor--.

Column 25, Line 33, that portion of the sentence reading:
"...The light-emitting substrate according to claim 7..."
Should read:
--The light-emitting substrate according to claim 8--.

Signed and Sealed this
Fifteenth Day of April, 2025

Coke Morgan Stewart
*Acting Director of the United States Patent and Trademark Office*